(12) United States Patent
Bando

(10) Patent No.: US 10,177,110 B2
(45) Date of Patent: Jan. 8, 2019

(54) ELECTRONIC DEVICE

(71) Applicant: Renesas Electronics Corporation, Tokyo (JP)

(72) Inventor: Koji Bando, Tokyo (JP)

(73) Assignee: Renesas Electronics Corporation, Tokyo ( * ) Notice: Subject to any disclaimer, the term of this patent is extended or adjusted under 35 U.S.C. 154(b) by 0 days.

(21) Appl. No.: 16/034,102

(22) Filed: Jul. 12, 2018

(65) Prior Publication Data
US 2018/0337158 A1 Nov. 22, 2018

Related U.S. Application Data

(63) Continuation of application No. 15/721,904, filed on Sep. 30, 2017, now Pat. No. 10,050,007.

(30) Foreign Application Priority Data

Oct. 31, 2016 (JP) .................. 2016-213676

(51) Int. Cl.
*H01L 23/12* (2006.01)
*H01L 23/053* (2006.01)
(Continued)

(52) U.S. Cl.
CPC .............. *H01L 24/49* (2013.01); *H01L 23/04* (2013.01); *H01L 23/3121* (2013.01); *H01L 23/3735* (2013.01); *H01L 23/4006* (2013.01); *H01L 23/562* (2013.01); *H01L 24/45* (2013.01); *H01L 24/48* (2013.01); *H01L 24/73* (2013.01); *H01L 25/072* (2013.01); *H01L 2023/4087* (2013.01);
(Continued)

(58) Field of Classification Search
None
See application file for complete search history.

(56) References Cited

U.S. PATENT DOCUMENTS

| 5,793,106 A | 8/1998 | Yasukawa et al. |
| 2015/0216038 A1* | 7/2015 | Wang .................. H05K 7/1432 361/709 |

FOREIGN PATENT DOCUMENTS

JP    H08-236667 A    9/1996

OTHER PUBLICATIONS

Extended European search report for European Patent Application No. 17198191.3, dated Feb. 23, 2018.

* cited by examiner

*Primary Examiner* — Calvin Y Choi
(74) *Attorney, Agent, or Firm* — Shapiro, Gabor and Rosenberger, PLLC

(57) ABSTRACT

An electronic device includes: a substrate having an upper surface (front surface) on which a semiconductor chip is mounted, and a lower surface (back surface) opposite to the upper surface; and a housing (case) fixed to the substrate through an adhesive material. The housing has through-holes each formed on one short side and the other short side in an X direction. The substrate is disposed between the through-holes. A part of the upper surface of the substrate is fixed so as to face a part of a stepped surface formed at a height different from that of a lower surface of the housing. Further, an interval (distance) between a part (stepped surface) extending along a short side of the housing in the stepped surface and the upper surface of the substrate is larger than an interval (distance) between a part (stepped surface) extending along a long side of the housing in the stepped surface and the upper surface of the substrate.

7 Claims, 21 Drawing Sheets

(51) Int. Cl.
*H01L 23/00* (2006.01)
*H01L 23/31* (2006.01)
*H01L 23/40* (2006.01)
*H01L 23/04* (2006.01)
*H01L 23/373* (2006.01)
*H01L 25/07* (2006.01)

(52) U.S. Cl.
CPC ............... *H01L 2224/32225* (2013.01); *H01L 2224/45124* (2013.01); *H01L 2224/48227* (2013.01); *H01L 2224/49175* (2013.01); *H01L 2224/73265* (2013.01)

ELECTRONIC DEVICE

CROSS-REFERENCE TO RELATED APPLICATION

The present application claims priority from Japanese Patent Application No. 2016-213676 filed on Oct. 31, 2016, the content of which is hereby incorporated by reference into this application.

TECHNICAL FIELD OF THE INVENTION

The present invention relates to an electronic device (semiconductor module) and relates to, for example, a technology effectively applied to an electronic device to which a case covering a semiconductor component(s) mounted on a substrate is attached.

BACKGROUND OF THE INVENTION

Japanese Patent Application Laid-Open No. 08-236667 (Patent Document 1) discloses an electronic device in which a plurality of semiconductor devices are mounted on a wiring substrate, a semiconductor chip forming an insulated gate bipolar transistor (IGBT) and a semiconductor chip forming a diode being sealed in each of the semiconductor devices.

SUMMARY OF THE INVENTION

A power conversion circuit such as an inverter circuit is incorporated in a power supply system that drives an air conditioner, an automobile, various kinds of industrial equipment, or the like. As an configuration example of the power conversion circuit, there is an electronic device (power conversion device, semiconductor module) in which a plurality of semiconductor chips each having a transistor (power transistor) operating as a switch element are mounted on a single substrate and are electrically connected to each other.

As an aspect of the electronic device, there is a configuration in which a plurality of semiconductor components such as semiconductor chips mounted on a substrate are connected to each other via a conductive member such as a wiring or a wire on the substrate. Also, there is a structure in which: a case having a through-hole for inserting a screw is attached to the substrate; and an electronic device can be fixed onto amounting substrate by screwing the case to the mounting substrate or the like (hereinafter, a module having the above structure is referred to as a case module).

The inventors of the present application have examined the reduction in a mounting area of the case module as apart of efforts to improve performance of the electronic device that is the case module described above. As a result, it has been found that, in the case module, a force tightened by the screw is transmitted to the substrate depending on a position of a hole into which a screw is to be inserted, and thereby the substrate may be damaged.

SUMMARY OF THE INVENTION

The above and other objects and novel characteristics of the present invention will be apparent from the description of the present specification and the accompanying drawings.

An electronic device according to one embodiment includes: a substrate having a front surface on which a semiconductor chip is mounted, and a back surface opposite to the front surface; and a case fixed to the substrate through an adhesive material. The case has a first hole formed on one short-side side and a second hole formed on the other short-side side in a first direction that is a longitudinal direction. When seen in a plan view from the back surface of the substrate, the substrate is disposed between the first and second holes. A part of the front surface of the substrate is fixed so as to face, through an adhesive material, a part of a stepped surface formed at a height different from that of a lower surface of the case. Further, an interval between a part extending along a short side of the case in the stepped surface and the front surface of the substrate is larger than an interval between a part extending along a long side of the case in the stepped surface and the front surface of the substrate.

According to one embodiment described above, the performance of an electronic device can be improved.

BRIEF DESCRIPTIONS OF THE DRAWINGS

Figure 1:
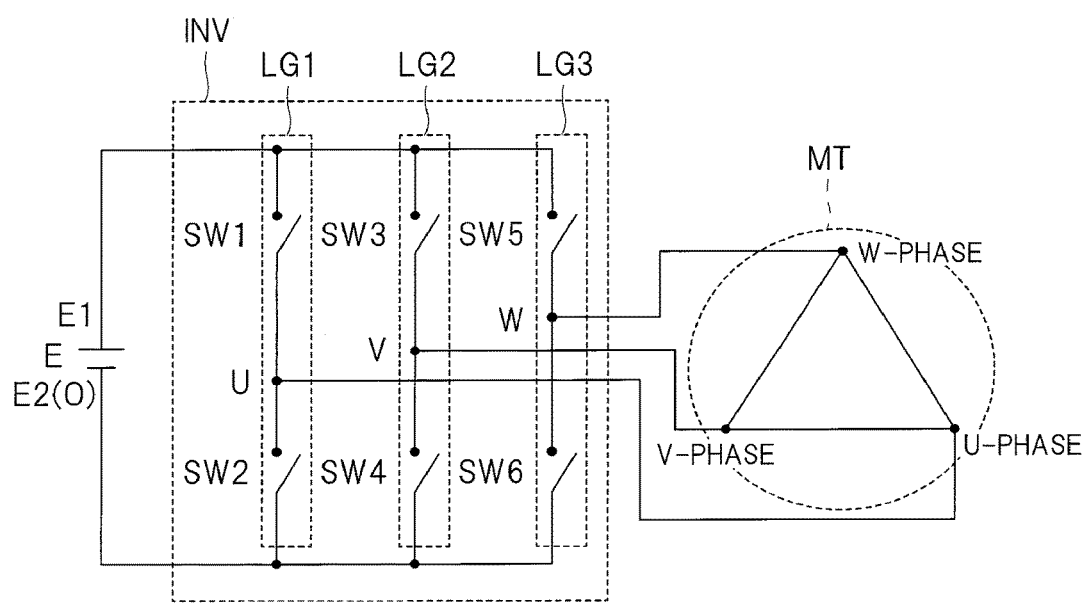
FIG. 1 is a circuit diagram of a three-phase inverter circuit disposed between a DC power supply and a three-phase induction motor.

DESCRIPTIONS OF THE PREFERRED EMBODIMENTS (Explanation of Descriptive Format, Basic Terms, and Usage in the Present Application)

In this application, embodiments will be described in a plurality of sections or the like when required as a matter of convenience. However, these sections are not independent and irrelevant to each other unless otherwise stated, and the one relates to the entire or a part of the other as a detail, a modification example or the like regardless of the order of descriptions. In addition, the description of the same or similar portions is not repeated in principle. Further, the components in the embodiments are not always indispensable unless otherwise stated or except for the case where the components are logically limited to that number and the components are apparently indispensable from the context.

Similarly, in the description of the embodiments, the phrase "X made of A" for a material, a composition or the like is not intended to exclude those containing elements other than A unless otherwise specified and except for the case where it clearly contains only A from the context. For example, as for a component, it means "X containing A as a main component". For example, a "silicon member" or the like is not limited to pure silicon and it is obvious that the silicon member includes a member made of silicon germanium (SiGe) alloy, a member made of multicomponent alloy containing silicon as a main component, and a member containing other additives or the like. In addition, gold plating, a Cu layer, nickel plating or the like includes a member containing gold, Cu, nickel or the like as a main component as well as a pure one unless otherwise indicated clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context.

Further, in the drawings for the embodiments, the same or similar components are denoted by the same or similar reference character or reference number, and the descriptions thereof are not repeated in principle.

In addition, in the attached drawings, hatching may be omitted even in cross sections in the case where it becomes rather complicated or the case where discrimination from void is clear. In this regard, when it is clear from the description or the like, an outline of a background may be omitted even in a planarly closed hole. Furthermore, even other than the cross section, hatching or dot patterns may be drawn so as to clarify non-voids or clarify a boundary of regions.

In the present embodiment, a power conversion device that is a semiconductor module including an inverter circuit (power conversion circuit) will be taken and described as an example of an electronic device in which a plurality of semiconductor devices are mounted on a substrate.

An inverter circuit is a circuit that converts DC power into AC power. For example, when plus and minus of a DC power supply are alternatively outputted, a direction of a current is reversed according thereto. In this case, since the direction of the current is alternately reversed, the output can be considered as AC power. This is the principle of the inverter circuit. Here, included in the AC power are various forms as represented by single-phase AC power or three-phase AC power. In the present embodiment, a three-phase inverter circuit that converts DC power into 3-phase AC power will be described as an example. However, the technical idea of the present embodiment is not limited to application to the three-phase inverter circuit and can be widely applied to, for example, a single-phase inverter circuit etc.

<Configuration of Three-Phase Inverter Circuit>

FIG. 1 is a circuit diagram of a three-phase inverter circuit disposed between a DC power supply and a three-phase induction motor. As illustrated in FIG. 1, a three-phase inverter circuit INV including six switches SW1 to SW6 is used for converting the DC power supply E into three-phase AC power. Specifically, as illustrated in FIG. 1, the three-phase inverter circuit INV includes: a leg LG1 in which the switch SW1 and the switch SW2 are connected in series; a leg LG2 in which the switch SW3 and the switch SW4 are connected in series; and a leg LG3 in which the switch SW5 and the switch SW6 are connected in series, and the legs LG1 to LG3 are connected in parallel. At this time, the switch SW1, the switch SW3, and the switch SW5 constitute an upper arm, and the switch SW2, the switch SW4, and the switch SW6 constitute a lower arm.

In addition, a point U between the switch SW1 and the switch SW2 is connected to a U-phase of a three-phase induction motor MT. Similarly, a point V between the switch SW3 and the switch SW4 is connected to a V-phase of the three-phase induction motor MT, and a point W between the switch SW5 and the switch SW6 is connected to a W-phase of the three-phase induction motor MT. In this way, the three-phase inverter circuit INV is configured.

<Circuit Operation>

Figure 2:
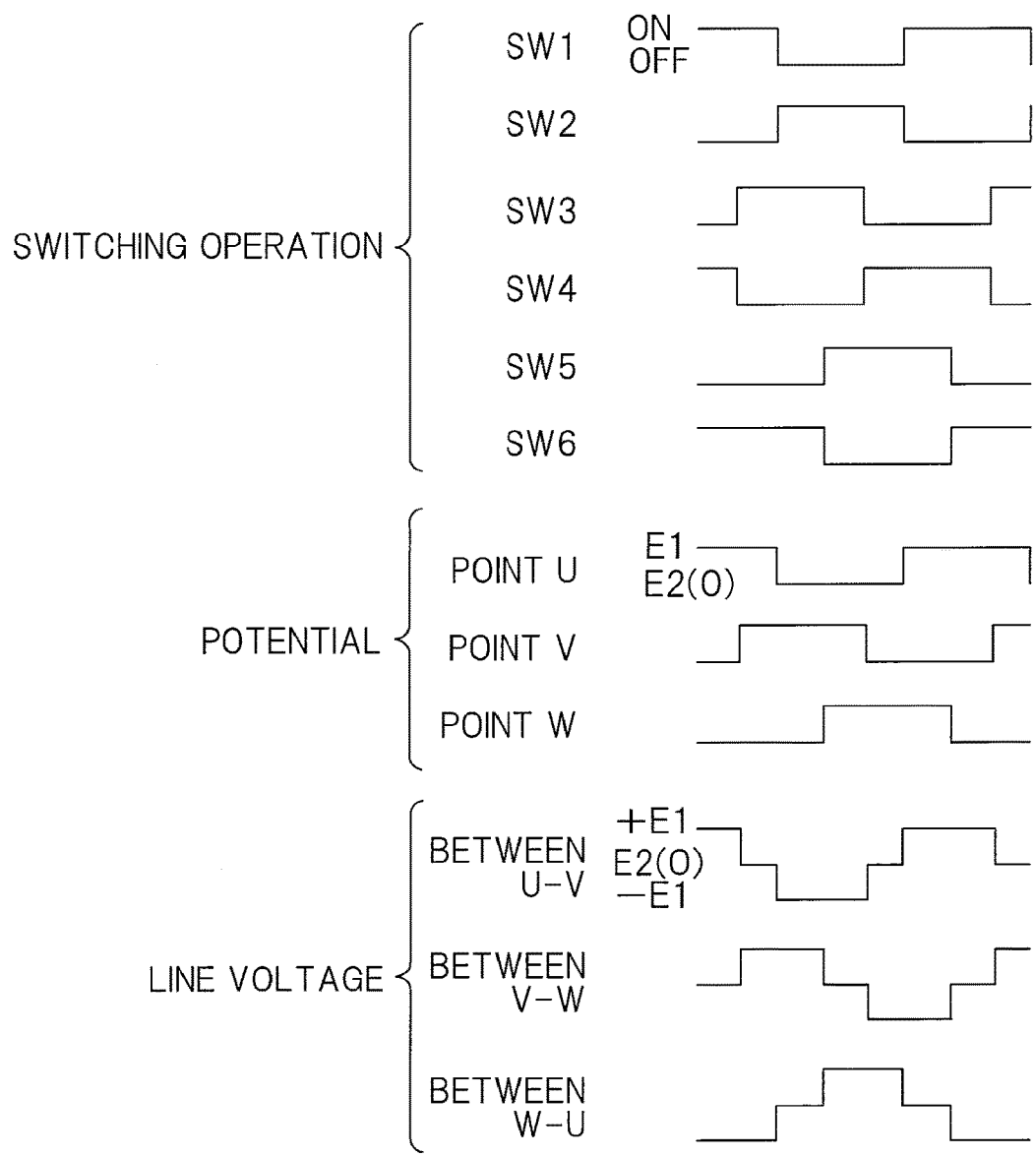
FIG. 2 is a timing chart describing an operation of the three-phase inverter circuit.

Next, an operation of the three-phase inverter circuit INV having the above-described configuration will be described. FIG. 2 is a timing chart describing the operation of the three-phase inverter circuit. As illustrated in FIG. 2, in the three-phase inverter circuit INV, the leg LG1 (see FIG. 1)

including the switch SW1 and the switch SW2 operates as follows. For example, when the switch SW1 is turned on, the switch SW2 is turned off. On the other hand, when the switch SW1 is turned off, the switch SW2 is turned on. In addition, the leg LG2 (see FIG. 1) including the switch SW3 and the switch SW4, and the leg LG3 (see FIG. 1) including the switch SW5 and the switch SW6 each operate in the same manner as the leg LG1. That is, when the switch SW3 is turned on, the switch SW4 is turned off. On the other hand, when the switch SW3 is turned off, the switch SW4 is turned on. In addition, when the switch SW5 is turned on, the switch SW6 is turned off. On the other hand, when the switch SW5 is turned off, the switch SW6 is turned on.

As illustrated in FIG. 2, the respective switching operations of three sets of switch pairs (that is, the legs LG1, LG2, and LG3 illustrated in FIG. 1) are performed so as to have a 120 degree phase difference from each other. At this time, a potential of each of the point U, the point V, and the point W changes to E2 (for example, a ground potential of 0 [V]) and E1 according to the switching operations of the three sets of switch pairs. For example, a line-to-line voltage between the U-phase and the V-phase forms such a voltage waveform as to change to +E1, E2 (0), and −E1 because the line-to-line voltage is obtained by subtracting a potential of the V-phase from a potential of the U-phase. A line-to-line voltage between the V-phase and the W-phase has a voltage waveform whose phase is shifted by 120 degrees with respect to the line-to-line voltage between the U-phase and the V-phase. Further, a line-to-line voltage between the W-phase and the U-phase has a voltage waveform whose phase is shifted by 120 degrees with respect to the line-to-line voltage between the V-phase and the W-phase. Thus, by making the switch SW1 to the switch SW6 operate, each line-to-line voltage has a stepped AC voltage waveform, and the AC voltage waveforms of the line-to-line voltages have a 120 degree phase difference from each other. Therefore, according to the three-phase inverter circuit INV, it is possible to convert, into the three-phase AC power, the DC power supplied from the DC power supply E.

Configuration Example of Circuit

Figure 3:
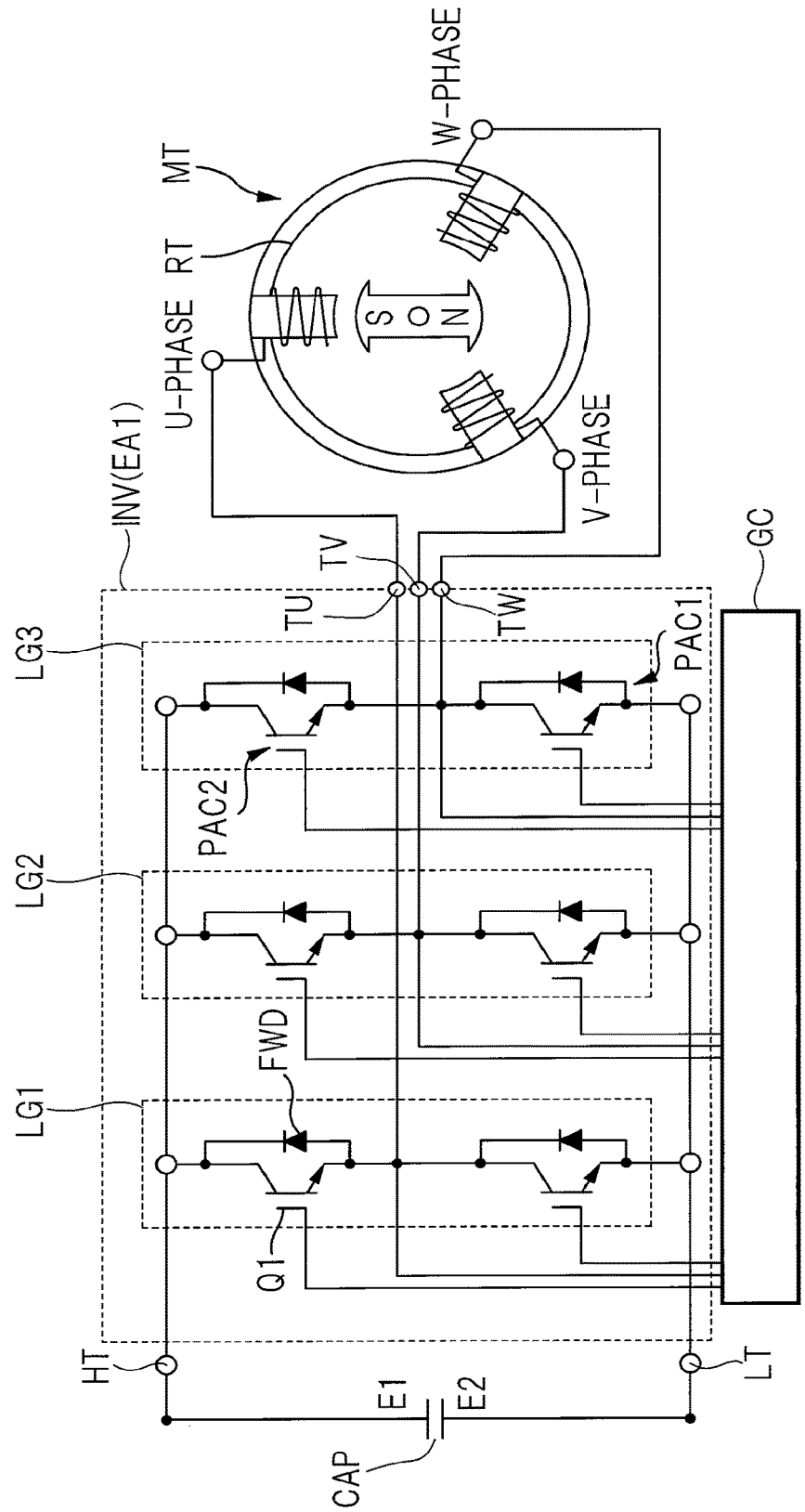
FIG. 3 is a circuit diagram illustrating a configuration of a motor circuit that includes an inverter circuit and a three-phase induction motor according to an embodiment.

An electronic device EA1 (see FIG. 3) according to the present embodiment is used in, for example, a driving circuit of a three-phase induction motor used in an automobile, an air conditioner, industrial equipment, or the like. An inverter circuit is included in the driving circuit, and the inverter circuit is a circuit that has a function of converting DC power into AC power. FIG. 3 is a circuit diagram illustrating a configuration of a motor circuit including an inverter circuit and a three-phase induction motor according to the present embodiment.

In FIG. 3, the motor circuit includes a three-phase induction motor MT and an inverter circuit INV. The three-phase induction motor MT is configured to be driven by three-phase voltages having different phases. In the three-phase induction motor MT, a rotating magnetic field is generated around a rotor RT as a conductor, by using three-phase AC called a U-phase, a V-phase, and a W-phase whose phases are shifted by 120 degrees from each other. In this case, the magnetic field rotates around the rotor RT. This means that a magnetic flux across the rotor RT as a conductor is changed. As a result, electromagnetic induction occurs in the rotor RT as a conductor, and an induced current flows through the rotor RT. The induced current flowing in the rotating magnetic field means that a force is applied to the rotor RT by the Fleming's left-hand rule, and the rotor RT is rotated by this force. In this way, the three-phase induction motor MT can rotate the rotor RT by using the three-phase AC. Thus, the three-phase induction motor MT requires the three-phase AC. Therefore, in the motor circuit, the three-phase AC is supplied to the three-phase induction motor by using the inverter circuit INV that produces AC from DC.

In the following, an actual configuration example of the inverter circuit INV will be described. As illustrated in FIG. 3, for example, in the inverter circuit INV according to the present embodiment, a transistor Q1 and a diode FWD are provided correspondingly to each of the three-phases. That is, in the actual inverter circuit INV, for example, each of the switches SW1 to SW6 illustrated in FIG. 1 includes a component element in which the transistor Q1 and the diode FWD as illustrated in FIG. 3 are connected in antiparallel. Namely, in FIG. 3, each of an upper arm and a lower arm of the leg LG1, an upper arm and a lower arm of the leg LG2, and an upper arm and a lower arm of the leg LG3 includes a component element in which the transistor Q1 and the diode FWD are connected in antiparallel.

The transistor Q1 illustrated in FIG. 3 is a power transistor (a transistor for a power circuit) incorporated in a circuit through, which a large current flows, such as a power conversion circuit and is, for example, an IGBT in the present embodiment. As a modification example, a power metal oxide semiconductor field effect transistor (power MOSFET) may be used as the switching element of the inverter circuit INV. Since the power MOSFET is a voltage-driven type that controls an on/off operation by a voltage applied to a gate electrode, the power MOSFET has an advantage of making it possible to perform high-speed switching. On the other hand, the power MOSFET has the property that an on-resistance increases and an amount of heat generation increases as withstanding pressure is made high. This is because the power MOSFET ensures a breakdown voltage by increasing a thickness of a low-concentration epitaxial layer (drift layer), and the increase in the thickness of the low-concentration epitaxial layer brings an increase in a resistance as an adverse effect.

In addition, as the switching element, there is also a bipolar transistor capable of handling large power. However, since the bipolar transistor is a current-driven type that controls an on/off operation by a base current, the bipolar transistor has the property that its switching speed is generally slower than that of the above-described power MOSFET.

Therefore, as the switching element, the IGBT is preferably used for applications requiring high-speed switching and large-power handling. The IGBT includes a combination of a power MOSFET and a bipolar transistor, and is a semiconductor element having both of a high-speed switching characteristic of the power MOSFET and the high withstanding-pressure characteristic of the bipolar transistor. That is, since the IGBT can perform the high-speed switching and the large-power handling, the IGBT is a semiconductor element suitable for the applications requiring the high-speed switching and the large-current handling. As described above, the inverter circuit INV according to the present embodiment adopts the IGBT as the transistor Q1 constituting the switching element.

In addition, in the inverter circuit INV according to the present embodiment, a transistor Q1 and a diode FWD are connected in antiparallel between a high side terminal (positive potential terminal) HT, to which a relatively high potential is supplied, and each phase (U-phase, V-phase, and W-phase) of the three-phase induction motor MT. In addition, a transistor Q1 and a diode FWD are connected in antiparallel between each phase of the three-phase induction motor MT and a low side terminal (negative potential terminal) LT, to which a relatively low potential is supplied. That is, two transistors Q1 and two diodes FWD are provided for each single-phase, and six transistors Q1 and six diodes FWD are provided for the three phases. A gate control circuit GC is connected to a gate electrode of each of the transistors Q1, and the switching operation of the transistor Q1 is controlled by the gate control circuit GC. The inverter circuit INV configured as above converts DC power into three-phase AC power by controlling the switching operations of the transistors Q1 through the gate control circuit GC, and supplies the three-phase AC power to the three-phase induction motor MT.

In the inverter circuit INV according to the present embodiment, the transistor Q1 is used as the switching element, but the diode FWD is provided to be connected in antiparallel to the transistor Q1. Simply, from the viewpoint that the switching function is realized by the switching element, the transistor Q1 is needed as the switching element, but it is considered that it is unnecessary to provide the diode FWD. In this regard, in a case where an inductance is included in a load connected to the inverter circuit INV, it is necessary to provide the diode FWD.

In a case where the load is a pure resistor that does not include the inductance, the diode FWD is unnecessary because there is no reflux energy. However, in a case where such a circuit including the inductance as a motor, is connected to the load, there is a mode in which a load current flows in a reverse direction to a switch turned on. That is, in a case where the inductance is included in the load, energy may return from the inductance of the load to the inverter circuit INV (the current may flow back).

At this time, since the transistor Q1 alone that is the IGBT does not have a function of being capable of making the reflux current flow, it is necessary to connect the diode FWD in antiparallel to the transistor Q1. That is, in the inverter circuit INV, in a case where the inductance is included in the load as like the motor control, the energy ($\frac{1}{2}LI^2$) accumulated in the inductance must be certainly released in turning the transistor Q1 off. However, the transistor Q1 alone cannot apply the reflux current for releasing the energy accumulated in the inductance. Therefore, in order to reflux the electrical energy accumulated in the inductance, the diode FWD is connected in antiparallel to the transistor Q1. That is, the diode FWD has a function of applying the reflux current so as to release the electrical energy accumulated in the inductance. From the above, in the inverter circuit connected to the load including the inductance, it is necessary to connect the diode FWD in antiparallel to the transistor Q1 that is the switching element. This diode FWD is referred to as a free wheel diode.

In addition, in the case of the inverter circuit INV according to the present embodiment, for example, a capacitive element CAP is connected between the high side terminal HT and the low side terminal LT as illustrated in FIG. 3. The capacitive element CAP has a function of, for example, smoothing a switching noise in the inverter circuit INV and/or stabilizing a system voltage. In the example illustrated in FIG. 3, the capacitive element CAP is provided outside the inverter circuit INV, but the capacitive element CAP may be provided inside the inverter circuit INV.

<Structure of Semiconductor Chip>

Figure 4:
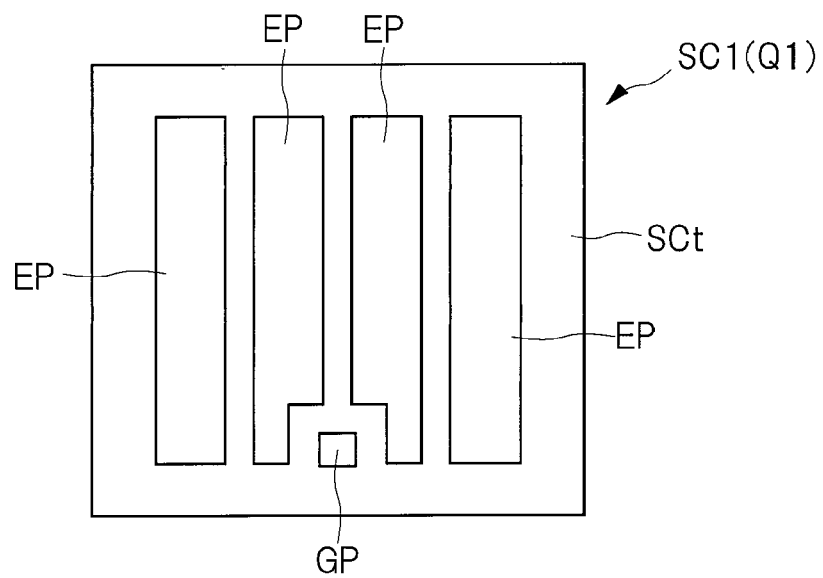
FIG. 4 is a plan view illustrating a shape of a front surface side of a semiconductor chip on which a transistor illustrated in FIG. 3 is formed.
Figure 5:
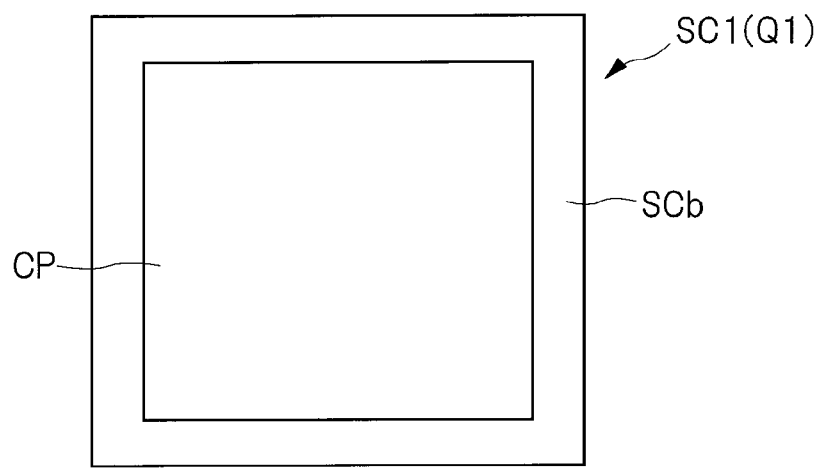
FIG. 5 is a plan view illustrating a back surface of the semiconductor chip illustrated in FIG. 4.
Figure 6:
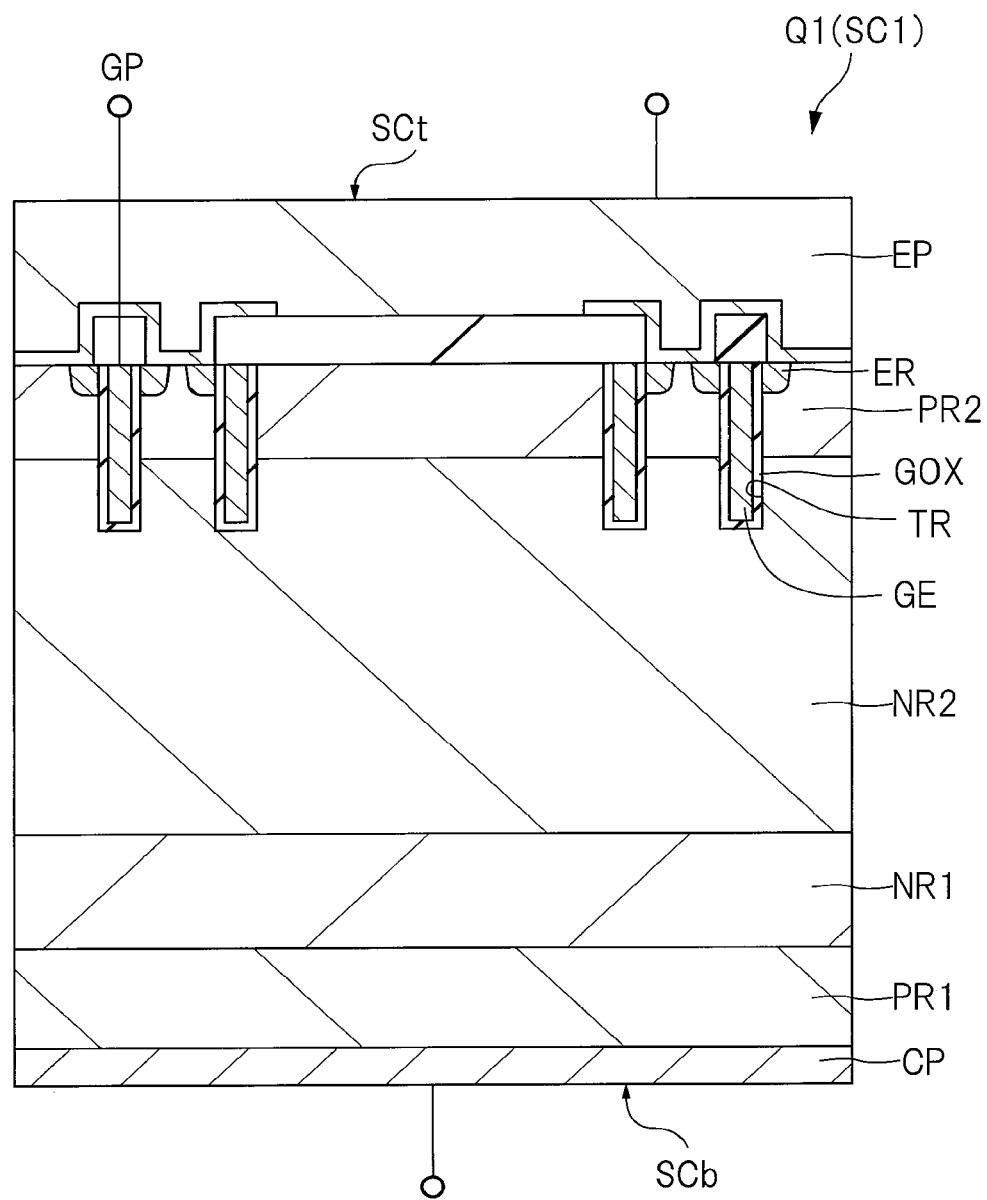
FIG. 6 is a cross-sectional view illustrating a structural example of the transistor that the semiconductor chip illustrated in FIGS. 4 and 5 has.

Next, a structure of the semiconductor chip including the transistors Q1 and the diodes FWD constituting the inverter circuit INV illustrated in FIG. 3 will be described with reference to the drawings. FIG. 4 is a plan view illustrating a shape of a front surface side of the semiconductor chip on which the transistor illustrated in FIG. 3 is formed. FIG. 5 is a plan view illustrating a back surface of the semiconductor chip illustrated in FIG. 4. FIG. 6 is a cross-sectional view illustrating a structural example of the transistor that the semiconductor chip illustrated in FIGS. 4 and 5 has.

In a case of the electronic device EA1 illustrated in FIG. 3, the transistors Q1 and the diodes FWD constituting the inverter circuit INV are formed on each of the semiconductor chips independent of each other. Hereinafter, the semiconductor chip on which the transistor Q1 is formed will be described, and then the semiconductor chip on which the diode FWD is formed will be described.

As illustrated in FIGS. 4 and 5, a semiconductor chip SC1 according to the present embodiment has a front surface (surface, upper surface, main surface) SCt (see FIG. 4), and a back surface (surface, lower surface, main surface) SCb (see FIG. 5) opposite to the front surface SCt. The front surface SCt and the back surface SCb of the semiconductor chip SC1 are each rectangular. An area of the front surface SCt and an area of the back surface SCb are equal to each other, for example.

As illustrated in FIG. 4, the semiconductor chip SC1 has a gate electrode (a gate electrode pad, a surface electrode) GP, and emitter electrodes (emitter electrode pads, surface electrodes) EP which are formed on the front surface SCt. In an example illustrated in FIG. 4, one gate electrode GP and a plurality of (four in FIG. 4) emitter electrodes EP are exposed on the front surface SCt. An exposed area of each of the plurality of emitter electrodes EP is larger than an exposed area of the gate electrode GP. Although its details will be described below, the emitter electrode EP is connected to an output terminal of the inverter circuit INV (see FIG. 3) or the low side terminal LT (see FIG. 3). Therefore, impedance of a transmission path through which a large current flows can be reduced by increasing the exposed area of the emitter electrode EP. In addition, the plurality of emitter electrodes EP are electrically connected to each other. In addition, as a modification example relative to FIG. 4, one large-area emitter electrode EP may be provided instead of the plurality of emitter electrodes EP. Furthermore, in a case where one large-area emitter electrode EP is provided, openings may be provided at a plurality of positions of an insulating film covering the emitter electrode EP, and a plurality of parts of the emitter electrode EP may be exposed from the plurality of openings.

In addition, as illustrated in FIG. 5, the semiconductor chip SC1 includes a collector electrode (a collector electrode pad, a back electrode) CP formed on the back surface SCb. The collector electrode CP is formed over the entire back surface SCb of the semiconductor chip SC1. As can be seen from a comparison between FIG. 4 and FIG. 5, an exposed area of the collector electrode CP is larger than the exposed areas of the emitter electrodes EP. Although its details are described below, the collector electrode CP is connected to the output terminal of the inverter circuit INV (see FIG. 3) or the high side terminal HT (see FIG. 3). Therefore, impedance of a transmission path through which a large current flows can be reduced by increasing the exposed area of the collector electrode CP.

Incidentally, a basic configuration of the semiconductor chip SC1 has been described in FIGS. 4 and 5, but various modification examples can be applied. For example, in addition to the electrodes illustrated in FIG. 4, provided may be electrodes for monitoring an operation state of the semiconductor chip SC1 or inspecting the semiconductor chip SC1, for example, an electrode for temperature detection, an electrode for voltage detection, an electrode for current detection, or the like. When these electrodes are provided, these electrodes are exposed from the front surface SCt of the semiconductor chip SC1 like the gate electrode GP. In addition, these electrodes correspond to electrodes for signal transmission, and the exposed area of each electrode is smaller than the exposed area of the emitter electrode EP.

In addition, the transistor Q1 included in the semiconductor chip SC1 has, for example, a structure as illustrated in FIG. 6. A p$^+$ type semiconductor region PR1 is formed on the collector electrode CP formed on the back surface SCb of the semiconductor chip SC1. An n$^+$ type semiconductor region NR1 is formed on the p$^+$ type semiconductor region PR1, and an n$^-$ type semiconductor region NR2 is formed on the n$^+$ type semiconductor region NR1. A p type semiconductor region PR2 is formed on the n$^-$ type semiconductor region NR2, and each trench TR that passes through the p type semiconductor region PR2 and reaches the n$^-$ type semiconductor region NR2 is formed. Furthermore, an n$^+$ type semiconductor region ER to be an emitter region is formed in alignment with the trench TR. A gate insulating film GOX made of, for example, a silicon oxide film is formed inside each trench TR, and a gate electrode GE is formed through the gate insulating film GOX. The gate electrode GE is made of, for example, a polysilicon film, and is formed to fill each trench TR.

In the transistor Q1 configured as above, the gate electrode GE is connected to the gate electrode GP illustrated in FIG. 4. Similarly, the n$^+$ type semiconductor region ER to be an emitter region is electrically connected to the emitter electrode EP. The p$^+$ type semiconductor region PR1 to be a collector region is electrically connected to the collector electrode CP formed on the back surface SCb of the semiconductor chip SC1.

The transistor Q1 configured as above has both of the high-speed switching characteristic and a voltage drive characteristic of the power MOSFET, and of a low on-voltage characteristic of the bipolar transistor.

Incidentally, the n$^+$ type semiconductor region NR1 is referred to as a buffer layer. The n$^+$ type semiconductor region NR1 is provided for preventing a punch-through phenomenon that, when the transistor Q1 is turned on, a depletion region growing from the p type semiconductor region PR2 to the n$^-$ type semiconductor region NR2 comes into contact with the p$^+$ type semiconductor region PR1 formed under the n type semiconductor region NR2. In addition, the n$^+$ type semiconductor region NR1 is provided for the purpose of limiting an amount of holes that are injected from the p$^+$ type semiconductor region PR1 to the n$^-$ type semiconductor region NR2.

In addition, the gate electrode of the transistor Q1 is connected to a gate control circuit GC illustrated in FIG. 3. At this time, the signal from the gate control circuit GC is applied to the gate electrode GE (see FIG. 6) of the transistor Q1 through the gate electrode GP (see FIG. 6), and thereby the switching operation of the transistor Q1 can be controlled from the gate control circuit GC.

Figure 7:
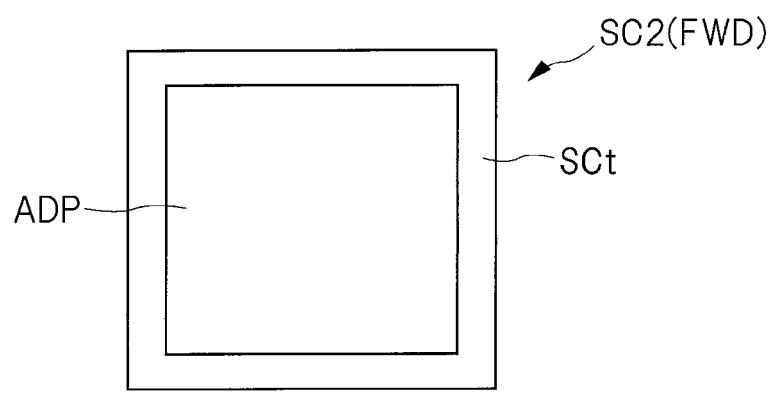
FIG. 7 is a plan view illustrating a shape of a front surface side of a semiconductor chip on which a diode illustrated in FIG. 3 is formed.
Figure 8:
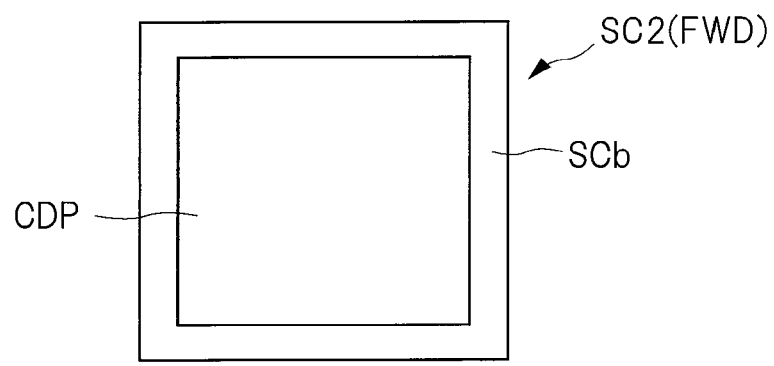
FIG. 8 is a plan view illustrating a back surface of the semiconductor chip illustrated in FIG. 7.

Next, the semiconductor chip on which the diode FWD illustrated in FIG. 3 is formed will be described. FIG. 7 is a plan view illustrating a shape of a front surface side of the semiconductor chip on which the transistor illustrated in FIG. 3 is formed. FIG. 8 is a plan view illustrating a back surface of the semiconductor chip illustrated in FIG. 7. In addition, FIG. 9 is a cross-sectional view illustrating a structural example of a diode that the semiconductor chip illustrated in FIGS. 7 and 8 has.

As illustrated in FIGS. 7 and 8, the semiconductor chip SC2 according to the present embodiment has a front surface (surface, upper surface, main surface) SCt (see FIG. 7) and a back surface (surface, lower surface, main surface) SCb (see FIG. 8) opposite to the front surface SCt. The front surface SCt and the back surface SCb of the semiconductor chip SC2 are each rectangular. An area of the front surface SCt and an area of the back surface SCb are equal to each other, for example. In addition, as can be seen from a comparison between FIG. 4 and FIG. 7, the area of the front surface SCt of the semiconductor chip SC1 (see FIG. 4) is larger than the area of the front surface SCt of the semiconductor chip SC2 (see FIG. 7).

In addition, as illustrated in FIG. 7, the semiconductor chip SC2 includes an anode electrode (an anode electrode pad, a surface electrode) ADP formed on the front surface SCt. Further, as illustrated in FIG. 8, the semiconductor chip SC2 includes a cathode electrode (a cathode electrode pad, a back electrode) CDP formed on the back surface SCb. The cathode electrode CDP is formed over the entire back surface SCb of the semiconductor chip SC2.

Figure 9:
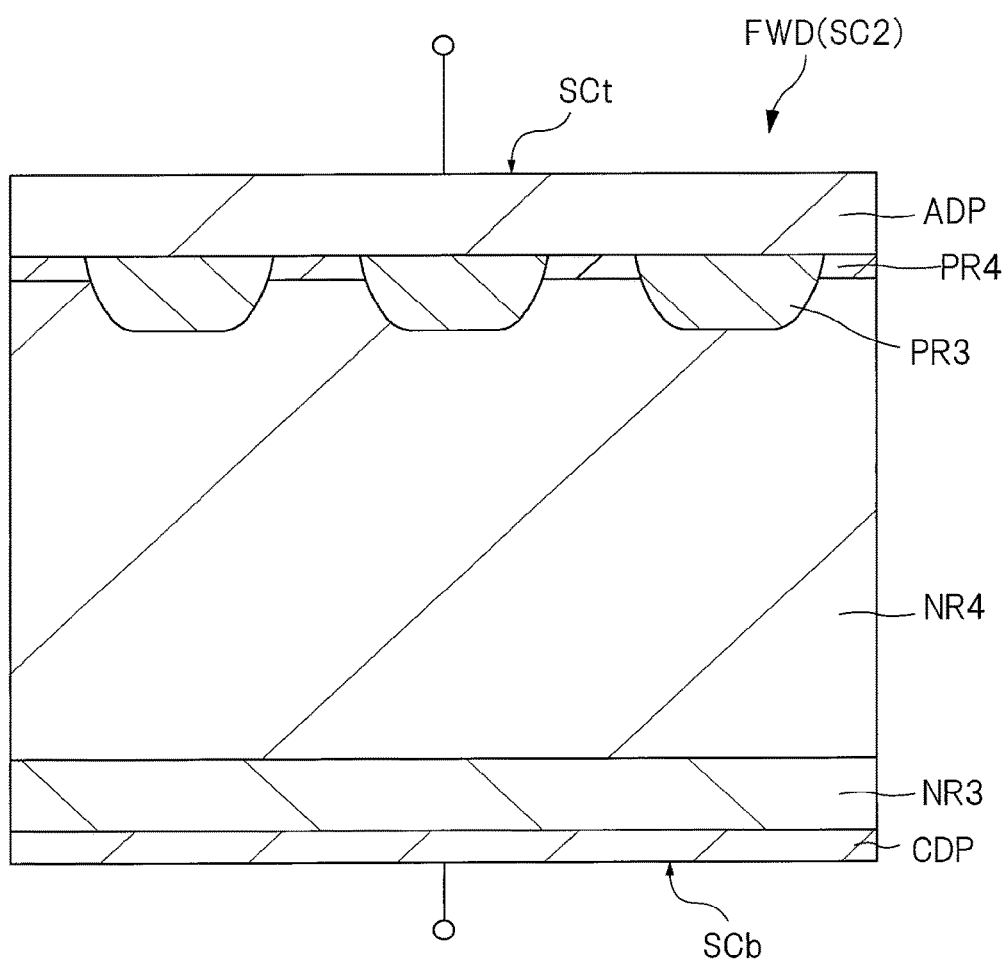
FIG. 9 is a cross-sectional view illustrating a structural example of a diode that the semiconductor chip illustrated in FIGS. 7 and 8 has.

In addition, the diode FWD included in the semiconductor chip SC2 has, for example, a structure as illustrated in FIG. 9. As illustrated in FIG. 9, an n$^+$ type semiconductor region NR3 is formed on the cathode electrode CDP formed on the back surface SCb of the semiconductor chip SC2. An n$^-$ type semiconductor region NR4 is formed on the n$^+$ type semiconductor region NR3, and p type semiconductor regions PR3 which are separated from each other are formed on the n$^-$ type semiconductor region NR4. P$^-$ type semiconductor regions PR4 are formed between the p type semiconductor regions PR3. An anode electrode ADP is formed on the p type semiconductor regions PR3 and the p$^-$ type semiconductor regions PR4. The anode electrode ADP is made of, for example, aluminum-silicon.

According to the diode FWD configured as above, when a positive voltage is applied to the anode electrode ADP and a negative voltage is applied to the cathode electrode CDP, a pn junction between the n$^-$ type semiconductor region NR4 and the p type semiconductor region PR3 is forward-biased, and a current flows therethrough. On the other hand, when a negative voltage is applied to the anode electrode ADP and a positive voltage is applied to the cathode electrode CDP, the pn junction between the n$^-$ type semiconductor region NR4 and the p type semiconductor region PR3 is reverse-biased and no current flows therethrough. In this way, it is possible to operate the diode FWD having a rectifying function.

<Structure of Electronic Device>

Figure 10:
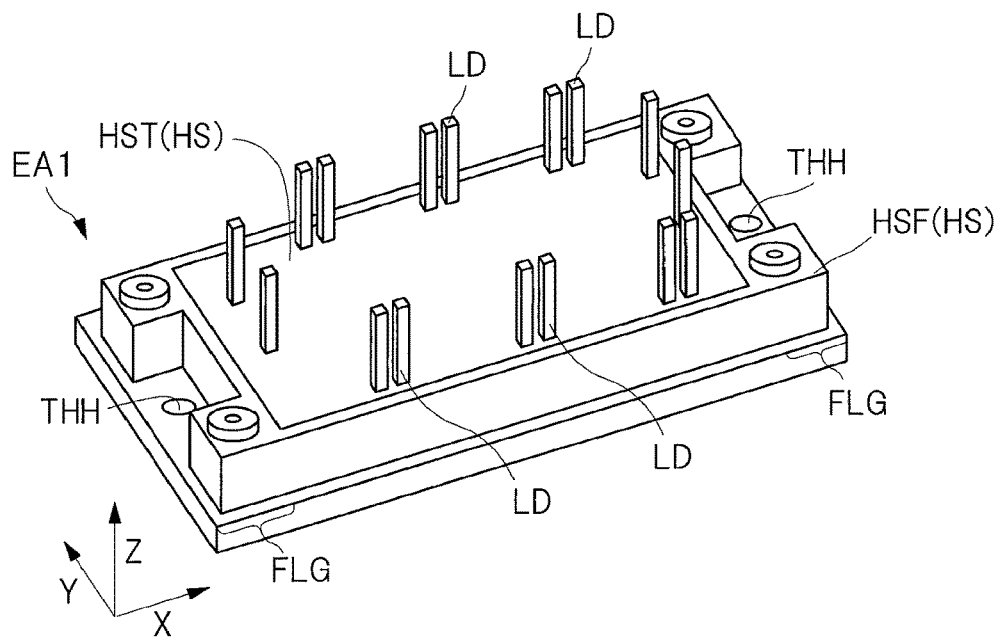
FIG. 10 is a perspective view illustrating an appearance of an electronic device illustrated in FIG. 3.
Figure 11:
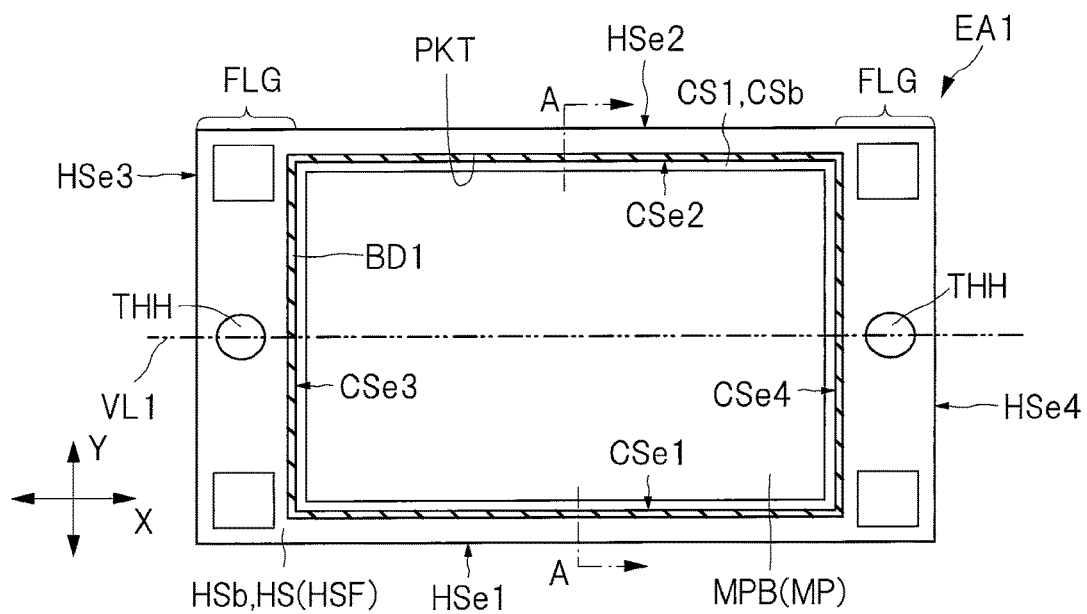
FIG. 11 is a plan view illustrating a back surface side of the electronic device illustrated in FIG. 10.
Figure 12:
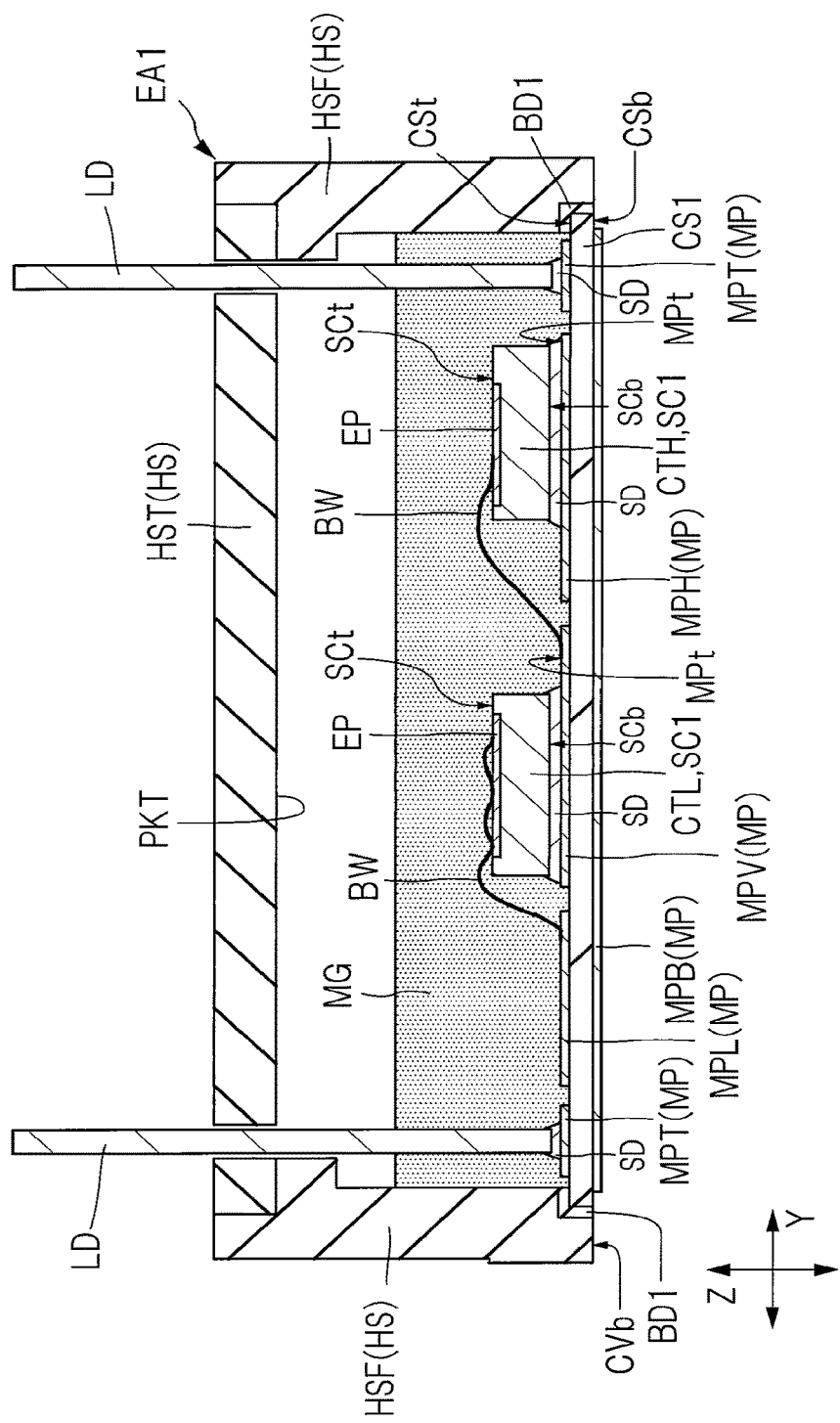
FIG. 12 is a cross-sectional view taken along line A-A of FIG. 11.
Figure 13:
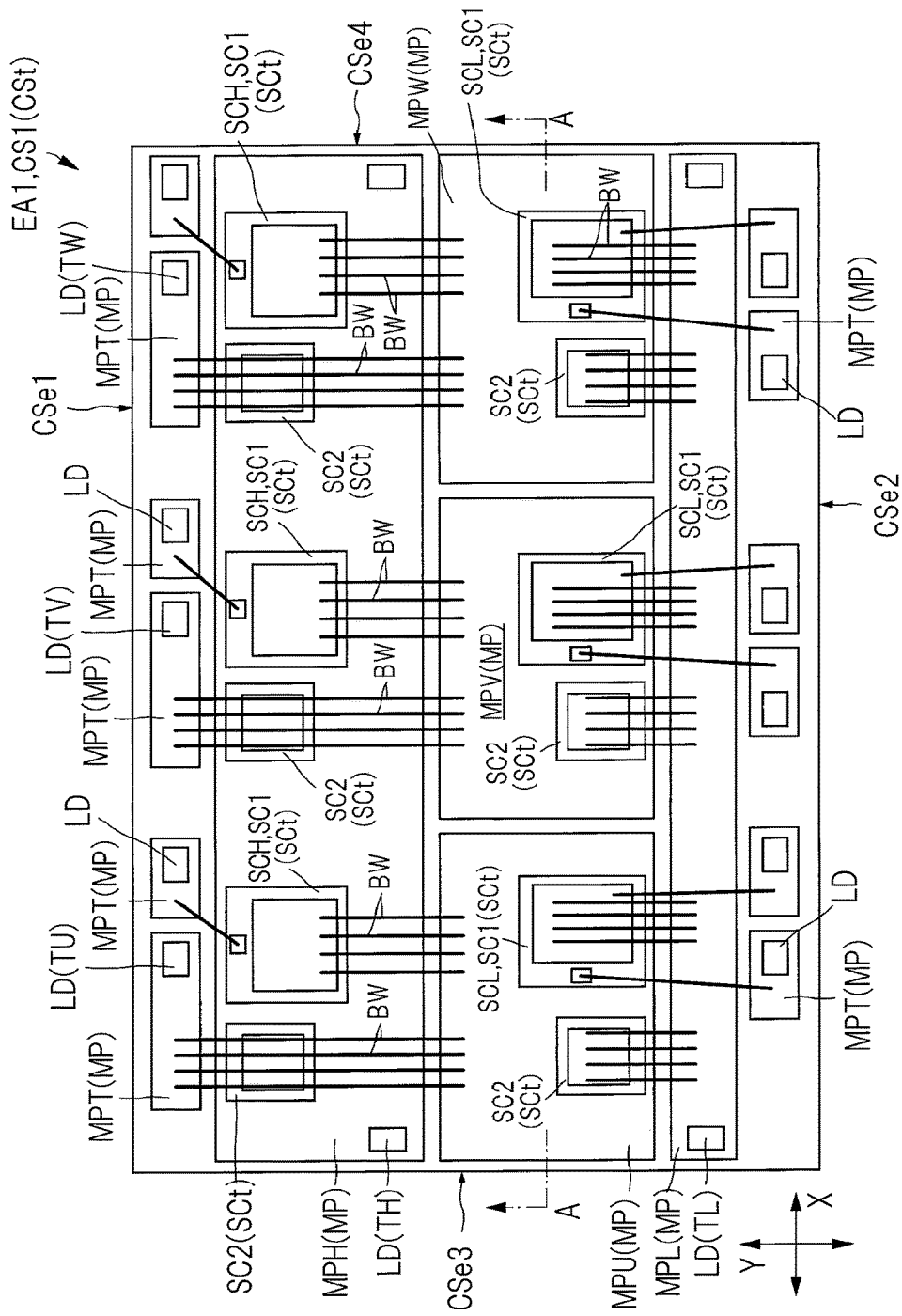
FIG. 13 is a plan view illustrating a layout of an upper surface side of a substrate illustrated in FIG. 11.

Next, a configuration example of an electronic device EA1 constituting the inverter circuit INV illustrated in FIG. 3 will be described. FIG. 10 is a perspective view illustrating an appearance of the electronic device illustrated in FIG. 3. In addition, FIG. 11 is a plan view illustrating a back surface side of the electronic device illustrated in FIG. 10. Although FIG. 11 is a plan view, an adhesive material BD1 exposed from around a lower surface CSb of a substrate CS1 is hatched and shown. In addition, FIG. 12 is a cross-sectional view taken along line A-A of FIG. 11. In addition, FIG. 13 is a plan view illustrating a layout of an upper surface side of a substrate illustrated in FIG. 11.

As illustrated in FIG. 10, the upper surface side of the electronic device EA1 according to the present embodiment, which constitutes the inverter circuit INV illustrated in FIG. 3, is covered with a housing (case) HS. The electronic device EA1 is a case module in which a plurality of semiconductor chips SC1 and SC2 (see FIG. 13) electrically connected to each other are accommodated in the housing HS and a plurality of terminals LD serving as external terminals are exposed from the housing HS.

The housing HS includes: a cover portion (a cover member, a cap) HST covering the plurality of semiconductor chips SC1 and SC2 (see FIG. 13); and a support portion (frame) HSF supporting the cover portion HST. Each of the support portion HSF and the cover portion HST constituting the housing HS is made of a resin material and contains, for example, a polyethylene terephthalate (hereinafter referred to as PET) as a main raw material. Incidentally, in a case of the present embodiment, the cover portion HST and the support portion HSF are independent of each other and are separable members. However, the cover portion HST and the support portion HSF may not be separable from each other. For example, the cover portion HST and the support portion HSF may be bonded and fixed through an adhesive material (s). Alternatively, the cover portion HST and the support portion HSF may be integrally formed.

In addition, as illustrated in FIG. 11, the support portion HSF continuously surrounds the periphery of the substrate CS1. As illustrated in FIG. 12, the cover portion HST covers an entire upper surface (surface, front surface, main surface) CSt of the substrate CS1. A space is provided inside the support portion HSF, and a plurality of semiconductor chips SC1 and SC2 mounted on the substrate CS1 are accommodated in a space (accommodation portion PKT) which is surrounded by the support portion HSF, the cover portion HST, and the substrate CS1. Although its details will be described below, a peripheral portion of the upper surface CSt of the substrate CS1 is bonded and fixed to the housing HS through the adhesive material (glue) BD1.

In addition, a plurality of terminals LD protrude from the cover portion HST of the housing HS. A plurality of through-holes (not illustrated) are formed in the cover portion HST of the housing HS, and the plurality of terminals LD are each inserted into the plurality of through-holes. Each of the plurality of terminals LD is an external terminal of the electronic device EA1 and is electrically connected to the plurality of semiconductor chips SC1 mounted on the substrate CS1 illustrated in FIG. 13.

In addition, as illustrated in FIG. 11, when seen in a plan view, the housing HS of the electronic device EA1 has: a side (long side) HSe1 extending along an X direction; a side (long side) HSe2 positioned opposite the side HSe1; aside (short side) HSe3 extending along a Y direction intersecting with (in FIG. 11, perpendicular to) the X direction; and a side (short side) HSe4 positioned opposite the side HSe3. In addition, the side HSe1 and the side HSe2 are relatively long as compared to the side HSe3 and the side HSe4. Incidentally, in the example illustrated in FIG. 11, when seen in a plan view, the housing HS of the electronic device EA1 forms a quadrangle (a rectangle in FIG. 11). However, as a planar shape of the electronic device EA1, there are various modification examples other than the quadrangle. For example, the electronic device EA1 may be formed to have such a pentagonal shape that a portion of an intersection point, at which the side HSe3 and the side HSe1 intersects with each other, among four corners of the quadrangle is cut diagonally to the X direction and the Y direction. In this case, the diagonally cut corner can be used as an alignment mark for identifying a direction(s) of the electronic device EA1.

In addition, as illustrated in FIGS. 10 and 11, the housing HS includes a flange portion (part) FLG that is an attachment part for fixing the electronic device EA1 to, for example, a heat sink, a support member, or the like. As illustrated in FIG. 11, the flange portions FLG are provided on both ends of the support portion HSF in the X direction that is a longitudinal direction of the housing HS, when seen in a plan view. In other words, the two flange portions FLG are disposed in the X direction and opposite each other through the accommodation portion PKT in which the substrate CS1 is accommodated. In addition, each through-hole (hole, screw hole, screw insertion hole) THH is formed at each center of the plurality of flange portions FLG. The through-holes THH are openings that pass through the flange portions FLG of the housing HS in a thickness direction. When the electronic device EA1 is fixed to, for example, the heat sink, the support member, or the like, the electronic device EA1 can be screwed by inserting screws BOL (see FIG. 15 described below) into the through-holes THH.

In the example illustrated in FIG. 11, two through-holes THH are formed along a virtual line (center line) VL1 extending in the X direction that is the longitudinal direction so as to connect a center of the side HSe3 and a center of the side HSe4. In the example illustrated in FIG. 11, the virtual line VL1 is a straight line that connects (passes through) a center point of the through-hole THH disposed on one side and a center point of the through-hole THH disposed on the other side in the X direction. In addition, in the example illustrated in FIG. 11, the virtual line VL1 runs (passes through) the lower surface CSb of the substrate CS1 when seen in a plan view from the lower surface (surface, back surface, main surface) CSb side of the substrate CS1. Here, a center point of the lower surface CSb of the substrate CS1 can be defined similarly to the center point of the upper surface (surface, front surface, main surface) CSt of the substrate CS1 illustrated in FIG. 13. That is, the center points of the lower surface CSb (see FIG. 11) and the upper surface CSt of the substrate CS1 illustrated in FIG. 13 are intersection points between: a line (virtual line not illustrated) connecting the center point of the side (long side, substrate side) CSe1 and the center point of the side (long side, substrate side) CSe2 of the substrate CS1; and a line (virtual line not illustrated) connecting the center point of the side (short side, substrate side) CSe3 and the center point of the side (short side, substrate side) CSe4. As for the housing HS, a detailed structure other than the above will be described below.

Next, the substrate CS1 accommodated in the accommodation portion PKT of the housing HS of the electronic device EA1, and each member fixed to the substrate CS1 will be described.

As illustrated in FIGS. 12 and 13, the electronic device EA1 includes: the substrate CS1; a plurality of metal patterns (patterns made of metal, metal films, patterns) MP formed on the upper surface CSt of the substrate CS1; and the plurality of semiconductor chips SC1 mounted on some of the plurality of metal patterns MP.

As illustrated in FIG. 12, the substrate CS1 has: an upper surface (front surface, main surface, surface) CSt that is a chip mounting surface on which the plurality of semiconductor chips SC1 are mounted; and a lower surface (back surface, main surface, surface) CSb positioned opposite the upper surface CSt. The substrate CS1 is a ceramic substrate made of a ceramic material. As a material constituting the substrate CS1, a nitride-based material such as aluminum nitride (AlN) can be used in addition to an oxide-based material such as alumina (aluminum oxide: $Al_2O_3$). In addition, as a material constituting a main component of the substrate, a material containing silicon (Si) as a main component can be used in addition to the above-mentioned aluminum. As a material using silicon as a main component, for example, a nitride-based material such as silicon nitride (Si₃N₄) can be exemplified.

As illustrated in FIG. 13, when seen in a plan view, the substrate CS1 has: a side (long side, substrate side) CSe1 extending along the X direction; a side (long side, substrate side) CSe2 positioned opposite the side CSe1; a side (short side, substrate side) CSe3 extending along the Y direction intersecting with (in FIG. 13, perpendicular to) the X direction; and a side (short side, substrate side) CSe4 positioned opposite the side CSe3. In addition, the side CSe1 and the side CSe2 are relatively long as compared to the side CSe3 and the side CSe4. In the example illustrated in FIG. 13, when seen in a plan view, the substrate CS1 forms a quadrangle (specifically, a rectangle).

In addition, as illustrated in FIG. 12, the plurality of metal patterns MP are bonded to the upper surface CSt and the lower surface CSb of the substrate CS1. Each of the plurality of metal patterns MP is, for example, a laminated film in which a nickel (Ni) film is laminated on a surface of a copper (Cu) film, and the copper film is directly bonded to the upper surface CSt or the lower surface CSb of the substrate CS1. Like the present embodiment, the substrate CS1 on which the semiconductor chip SC1 is directly mounted on the metal pattern MP made of copper is sometimes referred to as a direct bonding copper (DBC) substrate.

A metal pattern MPB formed on the lower surface CSb side of the substrate CS1 is a metal film constituting a heat radiation path of the electronic device EA1, and is uniformly formed to cover many parts of the lower surface CSb of the substrate CS1. By forming the metal film on the lower surface CSb of the substrate CS1 that is the ceramic substrate, a heat radiation characteristic of the electronic device EA1 can be improved. In addition, each of the plurality of metal patterns MP formed on the upper surface CSt of the substrate CS1 constitutes a part of a conduction path of the inverter circuit INV (see FIG. 3), and the metal patterns are separated (isolated) from each other.

The plurality of metal patterns MP include a metal pattern MPH to which a potential E1 (see FIG. 3) on a high-side side is supplied. In addition, the plurality of metal patterns MP include a metal pattern MPL to which a potential E2 (see FIG. 3) on a low-side side is supplied. In addition, the plurality of metal patterns MP include metal patterns MPU, MPV, and MPW to which a potential changing according to the switching operation of the transistor Q1 is supplied. In addition, the plurality of metal patterns MP include a plurality of metal patterns MPT for connecting terminals LD that are external terminals of the electronic device EA1.

Different potentials are supplied to the metal pattern MPU, the metal pattern MPV, and the metal pattern MPW so that the patterns MPU, MPV, and MPW each have a phase difference of 120 degrees. Therefore, the metal pattern MPU, the metal pattern MPV, and the metal pattern MPW are separated (isolated) from one another. In addition, the metal pattern MPU, the metal pattern MPV, and the metal pattern MPW are each connected through a plurality of wires BW to the metal patterns MPT, to which the output terminals LD (output terminals TU, TV, and TW) are connected. Therefore, the wires BW illustrated in FIG. 13 are included in transmission paths for outputs of the U-phase, the V-phase, and the W-phase illustrated in FIG. 3.

In the metal patterns MPH, the same potential (potential E1 (see FIG. 3) on the high-side side) is supplied to each of the U-phase, the V-phase, and the W-phase (see FIG. 3). Hence, the metal patterns MPH are integrally formed without being divided according to discrimination of the U-phase, the V-phase, and the W-phase. In other words, the potential E1 on the high-side side is supplied to each of the plurality of semiconductor chips SCH without passing through the wires BW. Incidentally, as a modification example relative to FIG. 13, the metal patterns MPH may be divided according to the discrimination of the U-phase, the V-phase, and the W-phase, and each of the divided metal patterns MPH may be electrically connected through a conductive pattern (not illustrated) such as a wire.

In addition, in the metal patterns MPL, the same potential (potential E2 (see FIG. 3) on the low-side side) is supplied to each of the U-phase, the V-phase, and the W-phase (see FIG. 3). Therefore, the metal patterns MPL are integrally formed without being divided according to the discrimination of the U-phase, the V-phase, and the W-phase. Incidentally, as a modification example relative to FIG. 13, the metal patterns MPL illustrated in FIG. 13 may be divided according to the discrimination of the U-phase, the V-phase, and the W-phase, and each of the divided metal patterns MPL may be electrically connected through a conductive member (not illustrated) such as a wire.

In addition, one terminal LD is connected to each of the plurality of metal patterns MPT among the above plurality of metal patterns MP. In addition, the plurality of terminals LD are formed in each of the metal pattern MPH and the metal pattern MPL among the plurality of metal patterns MP. In addition, one terminal LD is mounted on each of the metal pattern MPH and the metal pattern MPL along the side CSe3 and the side CSe4, which are the short sides among the four sides of the upper surface CSt of the substrate CS1.

In addition, the terminal LD is not mounted on each of the metal pattern MPU, the metal pattern MPV, and the metal pattern MPW among the plurality of metal patterns MP. In other words, the terminal LD is not directly connected to each of the metal pattern MPU, the metal pattern MPV, and the metal pattern MPW among the plurality of metal patterns MP. Each of the metal pattern MPU, the metal pattern MPV, and the metal pattern MPW is electrically connected to the metal pattern MPT through the plurality of wires BW. That is, each of the metal pattern MPU, the metal pattern MPV, and the metal pattern MPW is electrically connected to the terminal LD through the plurality of wires BW and the metal pattern MPT.

In addition, the plurality of semiconductor chips SC1 and SC2 are mounted on some (the metal pattern MPH, the metal pattern MPU, the metal pattern MPV, and the metal pattern MPW) of the plurality of metal patterns MP. As described with reference to FIG. 6, the plurality of semiconductor chips SC1 are switch elements in each of which the transistor Q1 as the IGBT is formed, and are mounted on each of the metal pattern MPH, the metal pattern MPU, the metal pattern MPV, and the metal pattern MPW. Those mounted on the metal pattern MPH among the semiconductor chips SC1 are semiconductor chips SCH corresponding to the switches SW1, SW3, and SW5 on the high-side side (see FIG. 1). In addition, those mounted on the metal pattern MPU, the metal pattern MPV, and the metal pattern MPW among the semiconductor chips SC1 are semiconductor chips SCL corresponding to the switches SW2, SW4, and SW6 on the low-side side (see FIG. 1). In addition, as described with reference to FIG. 9, the plurality of semiconductor chips SC2 include the diodes FWD. The plurality of semiconductor chips SC2 are respectively mounted on the metal pattern MPH, the metal pattern MPU, the metal pattern MPV, and the metal pattern MPW so that each semiconductor chip SC2 becomes a set with each of the plurality of semiconductor chips SC1.

As illustrated in FIG. 12, in the present embodiment, each of the semiconductor chips SC1 is bonded and fixed onto the metal pattern MP through a conductive adhesive material (a die bonding material, a conductive member, a connecting member, a bonding material) SD so that the back surface SCb of the semiconductor chip SC1 faces the upper surface (front surface) MPt of the metal pattern MP. The conductive adhesive material SD is, for example, solder, a conductive resin including a plurality of (many) conductive particles (for example, silver particles) in a resin, or the like. As illustrated in FIG. 5, the collector electrode CP is formed on the back surface SCb of the semiconductor chip SC1, and the collector electrode CP is electrically connected to the metal pattern MP through the conductive adhesive material SD illustrated in FIG. 12.

In addition, although omitted and not illustrated in FIG. 13, each of the semiconductor chips SC2 is bonded and fixed onto the metal pattern MP through the conductive adhesive material SD (see FIG. 12), so that the back surface SCb (see FIG. 8) of the semiconductor chip SC2 faces the upper surface (front surface) MPt of the metal pattern MP. As illustrated in FIG. 8, the cathode electrode CDP is formed on the back surface SCb of the semiconductor chip SC2, and the cathode electrode CDP is electrically connected to the metal pattern MP through the conductive adhesive material SD illustrated in FIG. 12.

In addition, as illustrated in FIG. 13, the plurality of wires BW are connected to the emitter electrode EP of the semiconductor chip SC1 (see FIG. 4). Specifically, the emitter electrode EP of the semiconductor chip SCH for the high side is connected to any one of the metal pattern MPU, the metal pattern MPV, and the metal pattern MPW through the plurality of wires BW. In other words, the emitter electrode EP of the semiconductor chip SCH for the high side is connected to any one of a U-phase output terminal TU, a V-phase output terminal TV, and a W-phase output terminal TW. In addition, the emitter electrode EP of the semiconductor chip SCL for the low side is connected to the metal pattern MPL through the plurality of wires BW. In other words, the emitter electrode EP of the semiconductor chip SCL for the low side is electrically connected to the low side terminal LT to which the potential E2 for the low side illustrated in FIG. 3 is supplied.

In addition, as illustrated in FIG. 13, one wire BW is connected to the gate electrode GP of the semiconductor chip SC1 (see FIG. 4). Specifically, as illustrated in FIG. 13, each of the gate electrodes GP (see FIG. 4) included in each of the semiconductor chip SCH for the high side and the semiconductor chip SCL for the low side is electrically connected to the metal pattern MPT through the wire BW. A driving signal (gate signal) for driving the switching operations of the transistors Q1 (see FIG. 3) included in the semiconductor chip SCH and the semiconductor chip SCL is supplied from the metal pattern MPT.

In addition, the plurality of wires BW are connected to the anode electrode ADP (see FIG. 7). Specifically, the anode electrode ADP of the semiconductor chip SC2 for the high side is connected to anyone of the metal pattern MPU, the metal pattern MPV, and the metal pattern MPW through the plurality of wires BW. In addition, the anode electrode ADP of the semiconductor chip SC2 for the high side is also connected to the output metal pattern MPT through the plurality of wires BW. In other words, the anode electrode ADP of the semiconductor chip SC2 for the high side is connected to any one of the U-phase output terminal TU, the V-phase output terminal TV, and the W-phase output terminal TW. In addition, the anode electrode ADP of the semiconductor chip SC2 for the low side is connected to the metal pattern MPL through the plurality of wires BW. In other words, the anode electrode ADP of the semiconductor chip SC2 for the low side is electrically connected to the low side terminal LT to which the potential E2 for the low side illustrated in FIG. 3 is supplied.

The plurality of wires BW illustrated in FIG. 13 are metal wires. In the present embodiment, the metal wires are made of, for example, aluminum. However, there are various modification examples in the material of the wire BW. In addition to aluminum, gold or silver can be used as the material.

In addition, as illustrated in FIG. 12, a sealing material (gel-like insulating material) MG is filled in a space between the housing HS and the substrate CS1. Each of the plurality of semiconductor chips SC1 and each of the plurality of wires BW are sealed by the sealing material MG. The sealing material MG is a member that protects the plurality of semiconductor chips SC1 and SC2, the plurality of wires BW, and a part of each terminal LD. As the sealing member, for example, there is a method of using a resin material such as an epoxy resin cured by heating to ensure a certain degree of strength. However, when the sealing material MG is cured, a stress occurs inside the electronic device EA1 due to a difference in linear expansion coefficient between the substrate CS1 and the sealing material MG if a temperature change is caused in the electronic device EA1. Therefore, in the present embodiment, the sealing material MG is formed by using a gel-like material (polymer compound) softer than the epoxy resin. Specifically, in the present embodiment, the sealing material MG is a silicone gel. The silicone gel is a type of a silicone resin that is a polymer compound having a main skeleton by a siloxane bond(s). The silicone resin is classified as a thermosetting resin cured by applying thermal energy, but has the property that its elasticity after curing is low elasticity like a natural rubber, for example. In addition, among silicone resins, the silicone gel is a resin that becomes a gel state after curing, and a density of a cross-linked structure of a chain polymer is lower than that of an elastomer called a silicone rubber. Therefore, the elasticity after the curing of the silicone gel is lower than the physical property after the curing of the silicone rubber. In the present embodiment, a silicone rubber is used as the adhesive material BD1 illustrated in FIG. 12, but the sealing material MG is lower in elasticity than the adhesive material BD1. In other words, the sealing material MG is softer than the adhesive material BD1 and is easily deformed. A stress generated when a temperature change occurs in the electronic device EA1 is reduced by the deformation of the sealing material MG that is a silicone resin.

<Mounting of Electronic Device>

Figure 14:
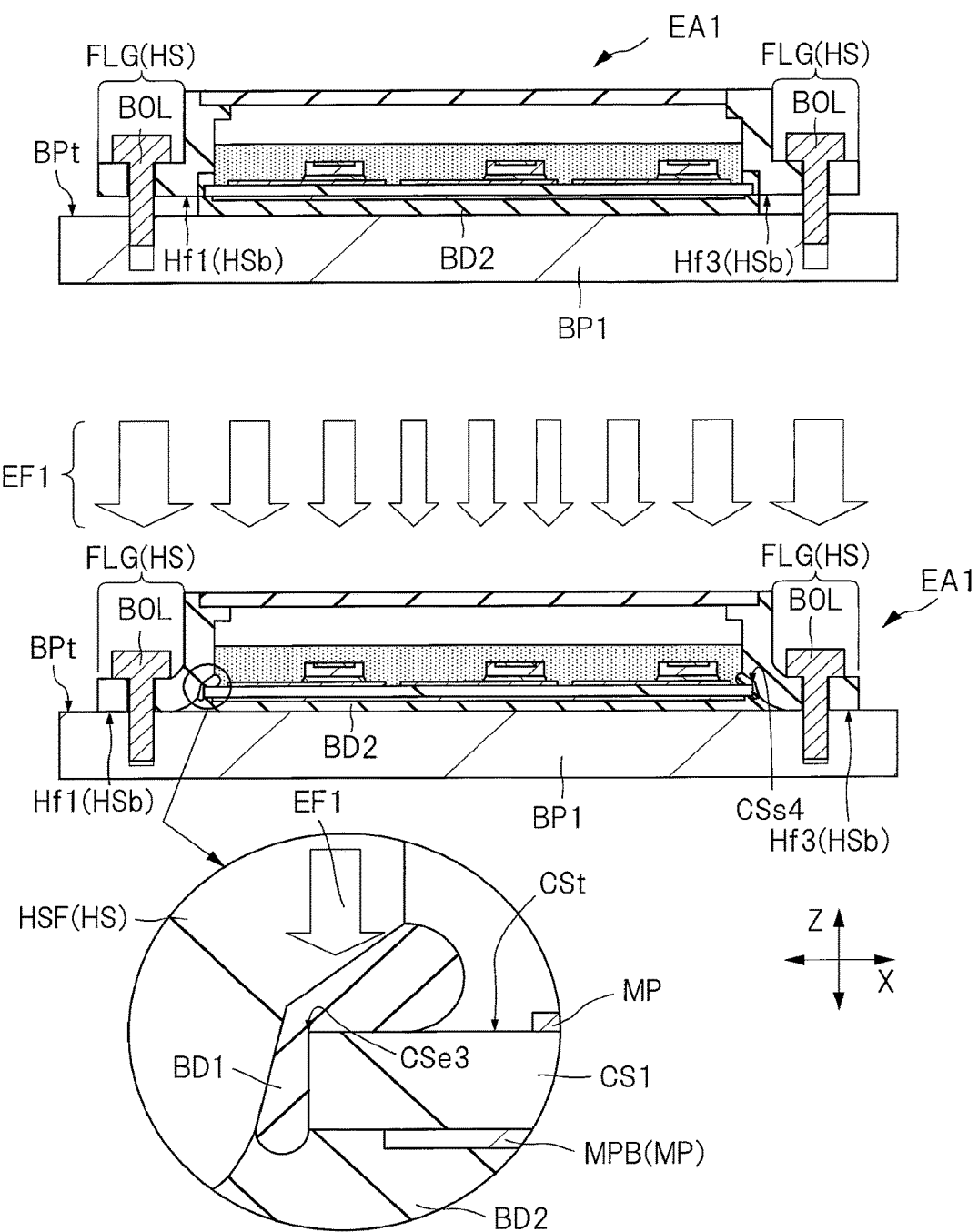
FIG. 14 is a cross-sectional view illustrating a state in which the electronic device illustrated in FIG. 10 is bonded on and then is screwed to a mounting substrate.
Figure 15:
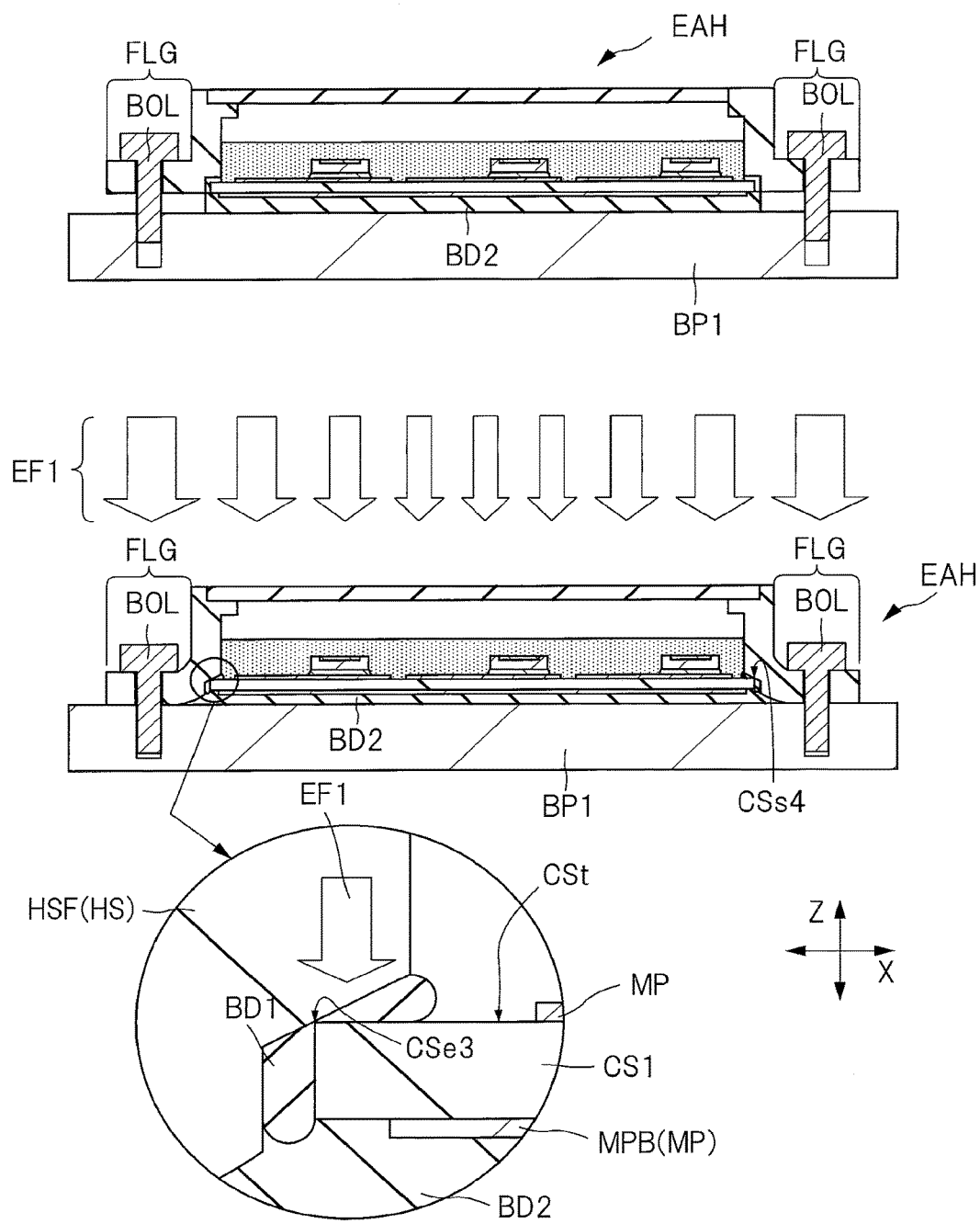
FIG. 15 is a cross-sectional view illustrating a state in which an electronic device as an examination example relative to FIG. 14 is bonded on and then is screwed to a mounting substrate.

Next, as a mounting aspect of the electronic device EA1 that is a case module, a method of mounting the electronic device EA1 on a mounting substrate will be described. FIG. 14 is a cross-sectional view illustrating a state in which the electronic device illustrated in FIG. 10 is bonded on and then screwed to the mounting substrate. In addition, FIG. 15 is a cross-sectional view illustrating a state in which an electronic device that is an examination example relative to FIG. 14 is bonded and then screwed to on a mounting substrate. Incidentally, in FIGS. 14 and 15, an external force EF1 applied to an electronic device EAH by tightening screws BOL is schematically illustrated by using a void arrow. In addition, in FIGS. 14 and 15, a magnitude of the external force EF1 is schematically indicated by a thickness of the arrow. Furthermore, FIGS. 14 and 15 correspond to the cross-sections taken along line A-A illustrated in FIG. 13.

In the electronic device EA1 illustrated in FIG. 14 and the electronic device EAH illustrated in FIG. 15, an amount of the adhesive material BD1 interposed between the substrate CS1 and the housing HS is different in the vicinity of the through-hole THH (see FIG. 11). Specifically, the electronic device EA1 and the electronic device EAH are different in a height of a stepped surface facing the substrate CS1 in the vicinity of the through-hole THH in the housing HS. In the case of the electronic device EAH described with reference to FIG. 15, respective intervals corresponding to a distance D1 in FIG. 16 and a distance D2 in FIG. 17, which are described below, are the same as those of a distance D3 illustrated in FIG. 19 and a distance D4 illustrated in FIG. 20. Thus, regarding this point, the electronic device EAH differs from the electronic device EA1 illustrated in FIG. 14. Due to the difference in the height of the stepped surface, the amount of the adhesive material BD1 interposed between the substrate CS1 and the housing HS in the electronic device EAH illustrated in FIG. 15 is smaller than the amount of the adhesive material BD1 interposed between the substrate CS1 and the housing HS in the electronic device EA1 illustrated in FIG. 14. Since the electronic device EA1 and the electronic device EAH are similar except for the above-described difference, redundant descriptions thereof are omitted. A detailed structure of the stepped surface of the electronic device EA1 illustrated in FIG. 14 will be described below.

As illustrated in FIG. 14, as a method of fixing the electronic device EA1 as a case module to the substrate (mounting substrate, base plate) BP1, there is a method of placing the electronic device EA1 on the substrate BP1 through a thermal conductive material (heat radiation grease) BD2 and then tightening the screws BOL down it. The thermal conductive material BD2 is, for example, a material in which metal particles or metal oxide particles having high thermal conductivity are mixed in a highly viscous liquid (semisolid) such as grease. The grease is obtained by adding, to a lubricating oil (base oil), a material (thickener) for adjusting viscosity or the like, and is higher in viscosity than oil. In the present embodiment, heat radiation grease, which uses silicone grease as base oil and is excellent in heat resistance and cold resistance, is used as the thermal conductive material BD2. By interposing the thermal conductive material BD2 between the metal pattern MPB formed on the lower surface CSb (see FIG. 11) of the substrate CS1 and the substrate BP1, a path cross-sectional area of a heat radiation path from the metal pattern MPB to the substrate BP1 becomes wide, and thus, heat radiation characteristics are improved. In addition, the grease that is the thermal conductive material BD2 is a material that is softer than the substrate CS1 and/or the adhesive material BD1 and is easily deformed. Therefore, the thermal conductive material BD2 functions as a stress relaxing layer that disperses a stress transmitted from the substrate BP1 to the substrate CS1 of the electronic device EA1 when the electronic device EA1 is fixed to the substrate BP1 by tightening the screws BOL.

When the screws BOL are tightened, as illustrated in FIG. 14, each of a lower surface Hf1 and a lower surface Hf3 of the flange portion FLG is pushed down so as to be closer to the upper surface (surface, main surface, mounting surface) BPt of the substrate BP1. Along with this, an external force EF1 is applied to the housing HS in a direction approaching the substrate BP1. As schematically illustrated in FIG. 14, the magnitude of the external force EF1 is not constant. In the electronic device EA1, the external force EF1 is relatively large at a position where a distance from the screw BOL is short. In addition, the external force EF1 is relatively small at a position where the distance from the screw BOL is remote. In each of the electronic device EA1 of the present embodiment and the electronic device EAH of the examination example illustrated in FIG. 15, the through-hole THH (see FIG. 11) is formed at the center of the flange portion FLG, and the screw BOL is inserted into the through-hole THH. Therefore, in the Y direction, the external forces EF1 applied to the flange portions FLG at both ends of the support portion HSF are larger than the external force EF1 applied to a region between the flange portions FLG. As a result, a portion of the housing HS around the flange portion FLG is deformed, and the flange portion FLG is pushed down to a position closer to the upper surface BPt of the substrate BP1 than the other portions.

At this time, as illustrated as an enlarged views in FIGS. 14 and 15, the external force EF1 from the housing HS is applied to the side (short side) CSe3 (and the side (short side) CSe4) of the substrate CS1, a distance to the screw BOL in the side CSe3 being short. It has been found that the substrate CS1 may be damaged depending on an extent of the external force EF1 applied to the substrate CS1.

In particular, from the viewpoint of miniaturizing the plane area (mounting area) of the electronic device EA1, it is preferable to reduce the distance from the screw BOL to the substrate CS1. However, as the distance from the screw BOL to the substrate CS1 is made smaller, a stronger force is applied to the substrate CS1.

Needless to say, numerical values provided below are merely examples, and various modification examples can be applied. For example, in the case of the electronic device EA1 of the present embodiment illustrated in FIG. 11 (the same applies to the electronic device EAH illustrated in FIG. 15), a distance between the centers of two through-holes THH in a plan view is 55 mm. In addition, an opening diameter (diameter of a circular opening) of the through-hole THH is about 4 mm, which is larger than a distance (about 3 mm) between the side HSe1 of the housing HS and the side CSe1 of the substrate CS1. In addition, a length (that is, each length of the side CSe1 and the side CSe2) of the substrate CS1 in the X direction that is a longitudinal direction is 42 mm, a length (each length of the side CSe3 and the side CSe4) thereof in the Y direction is 36 mm. Therefore, the length from the center of one through-hole THH to the side CSe3 or CSe4 of the substrate CS1 is about 5 mm to about 6 mm. In addition, the shortest distance from an edge of one through-hole THH to the side CSe3 or CSe4 of the substrate CS1 is smaller than the opening diameter of the through-hole THH.

It has been found that damage to the substrate CS1 becomes apparent when the numerical examples provided above are applied to the electronic device EAH illustrated in FIG. 15.

In addition, according to the examination of the inventors of the present application, it has been found that the damage to the substrate CS1 can be reduced when the distance from the screw BOL to the substrate CS1 is sufficiently long. This reason is considered as follows: the external force EF1 applied to the substrate CS1 can be reduced because a position of the screw BOL is far from the substrate CS1. However, in this case, there remains a problem of making the mounting area of the electronic device large due to the long distance between the screw BOL and the substrate CS1.

<Details of Structure of Housing>

Therefore, the inventor of the present application has examined a technique for suppressing damage to the substrate CS1 while reducing a mounting area, and has found the following method. That is, as illustrated in FIG. 14, there is a method of relaxing the external force EF1 applied to the substrate CS1 by thickening the thickness of the adhesive material BD1 interposed between the substrate CS1 and the support portion HSF of the housing HS. As described above, the adhesive material BD1 is made of a low-elasticity material such as silicone rubber. Therefore, when the external force EF1 is applied to the adhesive material BD1, the adhesive material BD1 made of a material having lower elasticity than the substrate CS1 is deformed, and thereby the direction of the external force EF1 is dispersed. In other words, a component of the external force EF1 which acts in a direction of damaging the substrate CS1 is relieved by the deformation of the adhesive material BD1. The component acting in the direction of damaging the substrate CS1 is, for example, a component in a thickness direction (Z direction) of the substrate CS1. The thickness direction of the substrate CS1 is a direction from one to the other of the upper surface CSt and the lower surface CSb of the substrate CS1 illustrated in FIG. 12. In other words, the thickness direction of the substrate CS1 is a direction intersecting with both of the X direction and the Y direction. The extent to which the external force EF1 is relaxed by the adhesive material BD1 increases in proportion to the amount of the adhesive material BD1. Therefore, the damage to the substrate CS1 can be suppressed by increasing the amount of the adhesive material BD1 interposed between the substrate CS1 and the housing HS on the sides CSe3 and CSe4 of the substrate CS1.

Figure 16:
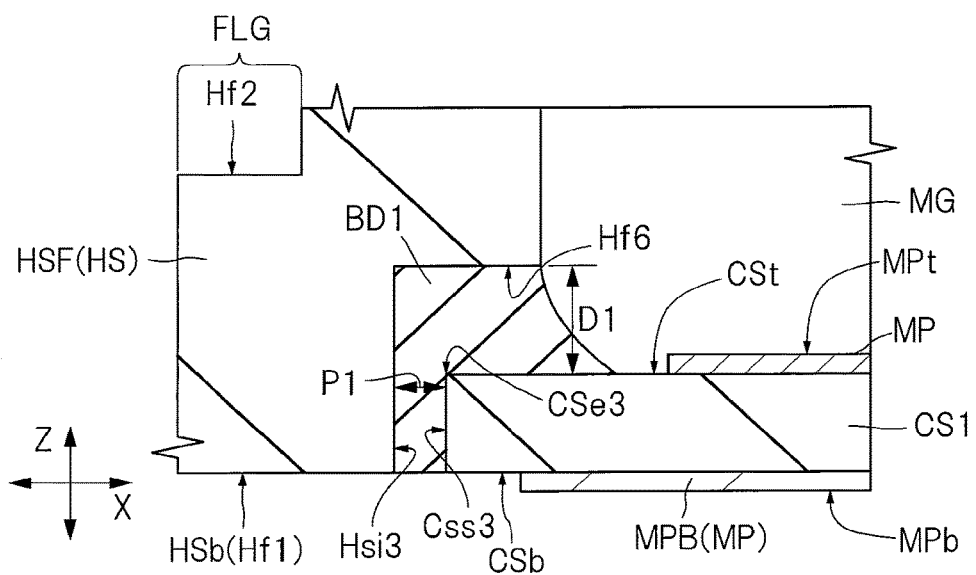
FIG. 16 is an enlarged cross-sectional view illustrating a state before an adhesive material enlarged and illustrated in FIG. 14 is deformed.

Increasing the amount of the adhesive material BD1 interposed between the substrate CS1 and the housing HS on the sides CSe3 and CSe4 of the substrate CS1 can be realized by the following method. FIG. 16 is an enlarged cross-sectional view illustrating a state before the adhesive material enlargedly shown in FIG. 14 is deformed. In addition, FIG. 17 is an enlarged cross-sectional view illustrating the periphery of the adhesive material in the flange portion positioned opposite the flange portion illustrated in FIG. 16.

The lower surface Hf1 and the upper surface Hf2 illustrated in FIG. 16 constitute the upper surface and the lower surface of the flange portion FLG on the side HSe3 side out of the two flange portions FLG illustrated in FIG. 11. The through-hole (first hole) THH formed on the side HSe3 side out of the through-holes THH illustrated in FIG. 11 is an opening extending from one of the lower surface Hf1 and the upper surface Hf2 to the other thereof. In addition, the lower surface Hf3 and the upper surface Hf4 illustrated in FIG. 17 constitute the upper surface and the lower surface of the flange portion FLG on the side HSe4 side out of the two flange portions FLG illustrated in FIG. 11. The through-hole (second hole) THH formed on the side HSe4 side out of the through-holes THH illustrated in FIG. 11 is an opening extending from one of the lower surface Hf3 and the upper surface Hf4 to the other thereof.

As illustrated in FIG. 16, the support portion HSF of the housing HS has: the lower surface (surface, mounted surface, lower surface of the flange portion) Hf1 constituting the lower surface HSb (lower surface of the flange portion FLG) of the housing HS; and the upper surface (surface, screw insertion surface, upper surface of the flange portion) Hf2 positioned opposite the lower surface Hf1. In addition, the support portion HSF of the housing HS is positioned at a height between the lower surface Hf1 and the upper surface Hf2 by regarding the lower surface Hf1 as a reference surface, and a part of the support portion HSF has a stepped surface (surface, substrate holding surface) Hf6 facing the upper surface CSt of the substrate CS1. At this time, by increasing a distance D1 that is an interval between the stepped surface Hf6 and the upper surface CSt of the substrate CS1, the amount (thickness) of the adhesive material BD1 interposed between the substrate CS1 and the housing HS increases in the side CSe3 of the substrate CS1.

Figure 17:
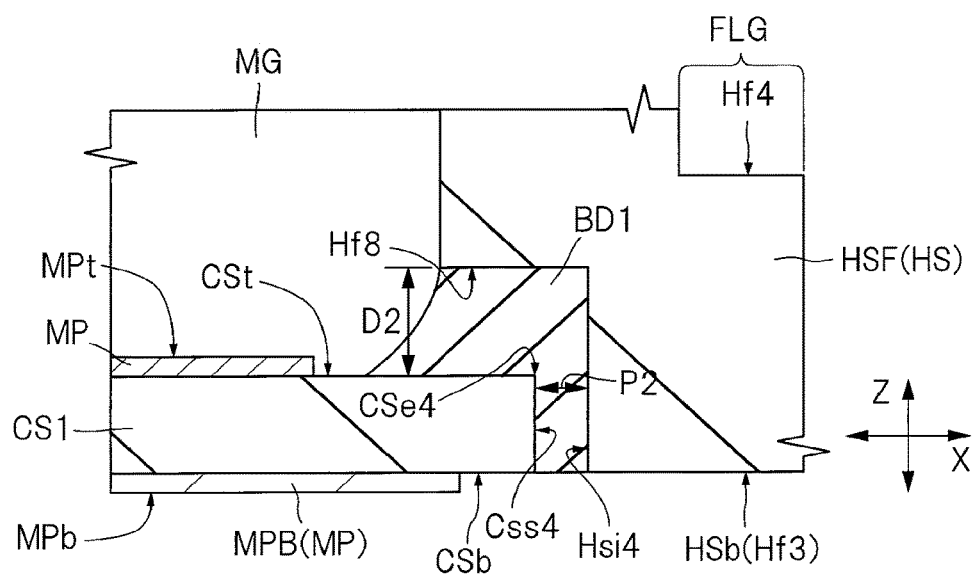
FIG. 17 is an enlarged cross-sectional view illustrating a periphery of an adhesive material in a flange portion positioned opposite a flange portion illustrated in FIG. 16.

In addition, as illustrated in FIG. 17 showing the periphery of the flange portion FLG opposite to the flange portion FLG illustrated in FIG. 16, the support portion HSF of the housing HS has: the lower surface (surface, mounted surface, lower surface of the flange portion) Hf3 constituting the lower surface HSb (lower surface of the flange portion FLG) of the housing HS; and the upper surface (surface, screw insertion surface, upper surface of the flange portion) Hf4 positioned opposite the lower surface Hf3. In addition, the support portion HSF of the housing HS is positioned at a height between the lower surface Hf3 and the upper surface Hf4 by regarding the lower surface Hf3 as a reference surface, and a part of the support portion HSF has a stepped surface (surface, substrate holding surface) Hf8 facing the upper surface CSt of the substrate CS1. At this time, by increasing a distance D2 that is an interval between the stepped surface Hf8 and the upper surface CSt of the substrate CS1, the amount (thickness) of the adhesive material BD1 interposed between the substrate CS1 and the housing HS increases in the side CSe4 of the substrate CS1. In the example illustrated in FIGS. 16 and 17, the distance D1 and the distance D2 are equal to each other, for example, about 0.5 mm which is equal to the thickness of the substrate CS1. The values of the distance D1 and the distance D2 are greater than the thickness of the metal pattern MP, on which the semiconductor chip SC1 is mounted, among the plurality of metal patterns MP illustrated in FIG. 13. Incidentally, in the example of the present embodiment, the thicknesses (lengths in Z direction, the film thicknesses) of the plurality of metal patterns MP are equal to each other, for example, 0.3 mm. Incidentally, various modification examples can be applied to the thicknesses of the metal patterns MP. Therefore, for example, when the thickness of the metal pattern is thick, the distance D1 illustrated in FIG. 16 and/or the distance D2 illustrated in FIG. 17 may be smaller than the thickness of the metal pattern MP.

In addition, each magnitude of the distance D1 illustrated in FIG. 16 and the distance D2 illustrated in FIG. 17 can be expressed as follows. That is, the plurality of semiconductor chips SC1 illustrated in FIG. 12 each have the front surface SCt and the back surface SCb. In the Z direction that is the thickness direction of the substrate CS1, the stepped surface Hf6 of the housing HS illustrated in FIG. 16 is positioned at a height between the front surface SCt and the back surface SCb of the semiconductor chip SC1 illustrated in FIG. 12. In addition, in the Z direction that is the thickness direction of the substrate CS1, the stepped surface Hf8 of the housing HS illustrated in FIG. 17 is positioned at a height between the front surface SCt and the back surface SCb of the semiconductor chip SC1 illustrated in FIG. 12.

In addition, as illustrated in FIGS. 16 and 17 in the present embodiment, the lower surface Hf1 (and the lower surface Hf3 illustrated in FIG. 17) of the housing HS is positioned at a height between the upper surface CSt of the substrate CS1 and the lower surface MPb of the metal pattern MPB in the Z direction that is the thickness direction of the substrate CS1. In other words, in the lower surface HSb of the housing HS, at least a part of the metal pattern MPB formed on the lower surface CSb of the substrate CS1 protrudes in a direction from the upper surface CSt to the lower surface CSb with respect to a surface extending from the lower surface Hf1 (and the lower surface Hf3 illustrated in FIG. 17). Therefore, the distance D1 illustrated in FIG. 16 and/or the distance D2 illustrated in FIG. 17 can be increased, so that the amount (the thickness in the Z direction) of the adhesive material BD1 interposed between the substrate CS1 and the housing HS is increased.

In addition, as a method of increasing the amount (thickness) of the adhesive material BD1 interposed between the substrate CS1 and the housing HS in the X direction illustrated in FIG. 16 and/or FIG. 17, there is a method of increasing a distance P1 illustrated in FIG. 16 and/or a distance P2 illustrated in FIG. 17. Specifically, as illustrated in FIG. 16, the support portion HSF of the housing HS has an inner surface Hsi3 which is continuous with the lower surface Hf1 of the housing HS and whose part faces the side surface (short side surface) Css3 of the substrate CS1. In the example illustrated in FIG. 16, the inner surface Hsi3 is continuous with each of the lower surface Hf1 and the stepped surface Hf6. In addition, as illustrated in FIG. 17, the support portion HSF of the housing HS has an inner surface Hsi4 which is continuous with the lower surface Hf3 of the housing HS and whose part faces the side surface (short side surface) Css4 of the substrate CS1. In the example illustrated in FIG. 17, the inner surface Hsi4 is continuous with each of the lower surface Hf3 and the stepped surface Hf8. Here, when the distance P1 that is an interval between the inner surface Hsi3 and the side surface Css3 of the substrate CS1 illustrated in FIG. 16 is large, the amount of the adhesive material BD1 between the inner surface Hsi3 and the side surface Css3 of the substrate CS1 can be increased. In addition, when the distance P2 that is an interval between the inner surface Hsi4 and the side surface Css4 of the substrate CS1 illustrated in FIG. 17 is large, the amount of the adhesive material BD1 between the inner surface Hsi4 and the side surface Css4 of the substrate CS1 can be increased. However, when the distance P1 illustrated in FIG. 16 and/or the distance P2 illustrated in FIG. 17 are/is increased, the mounting area of the electronic device EA1 is increased. Therefore, from the viewpoint of reducing the mounting area, it is preferable that the distances P1 and P2 are small. In the example of the present embodiment, the distance D1 illustrated in FIG. 16 is larger than the distance P1, and the distance D2 illustrated in FIG. 17 is larger than the distance P2.

Figure 18:
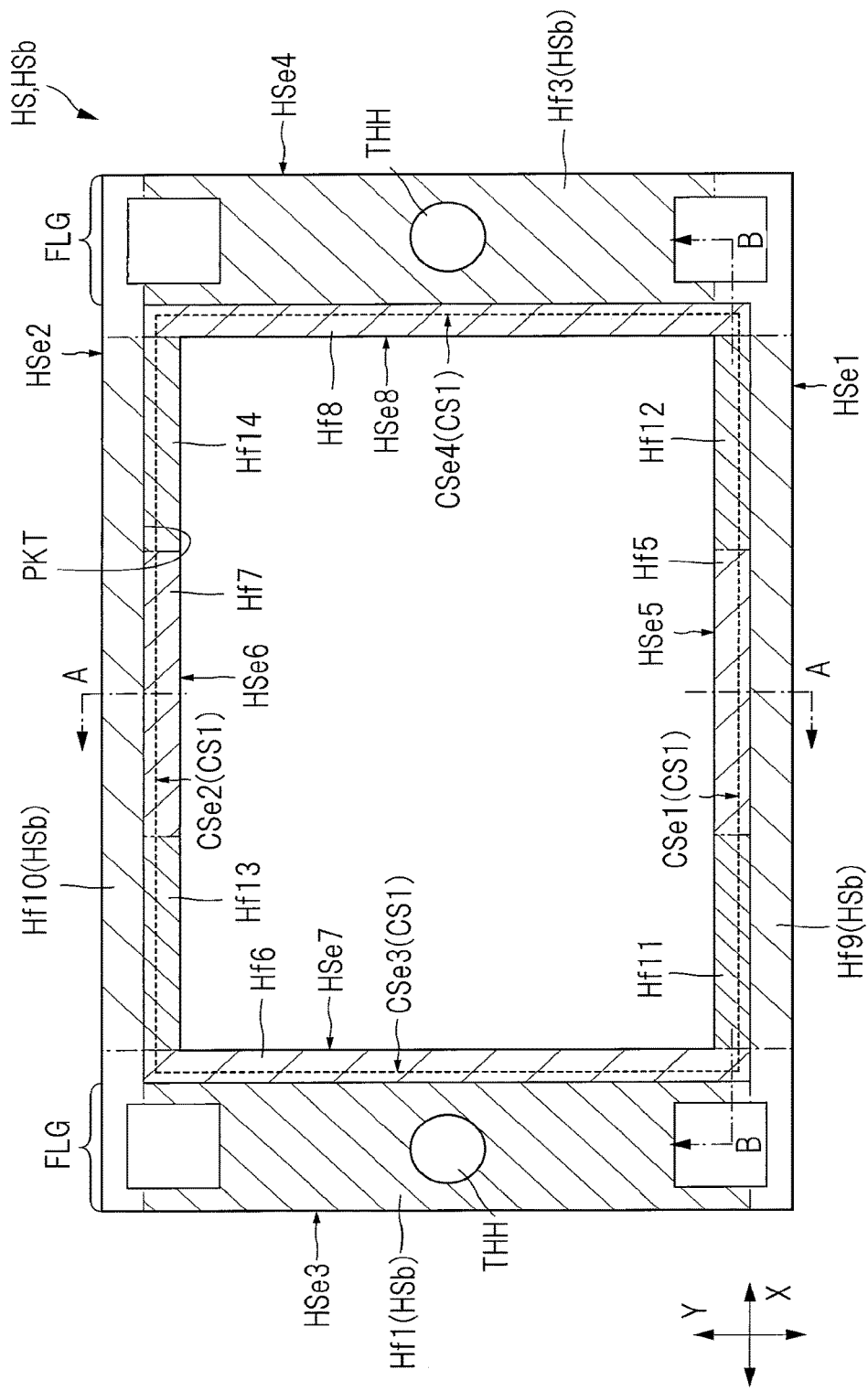
FIG. 18 is a plan view illustrating a lower surface side of a housing illustrated in FIG. 11.
Figure 19:
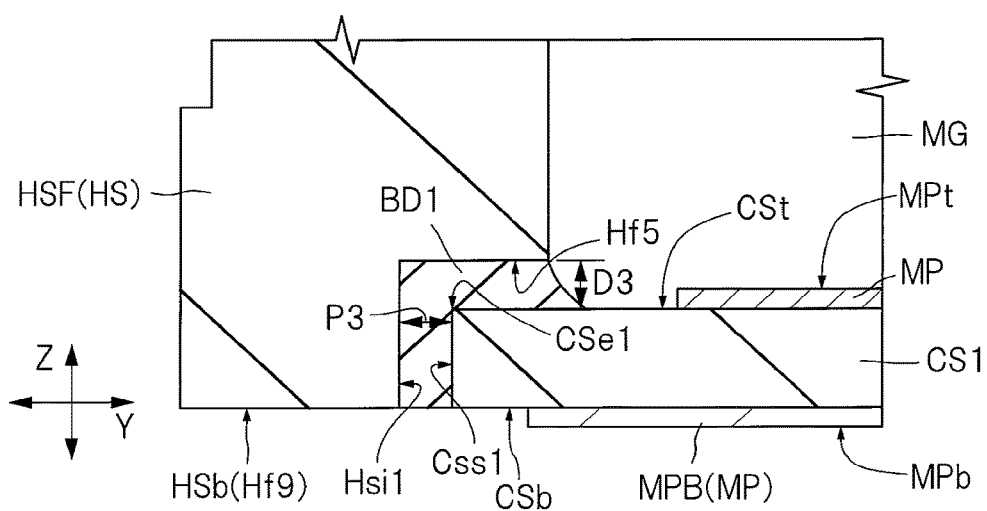
FIG. 19 is an enlarged cross-sectional view enlarging and illustrating a periphery of a stepped surface in a cross-section taken along line A-A of FIG. 18.
Figure 20:
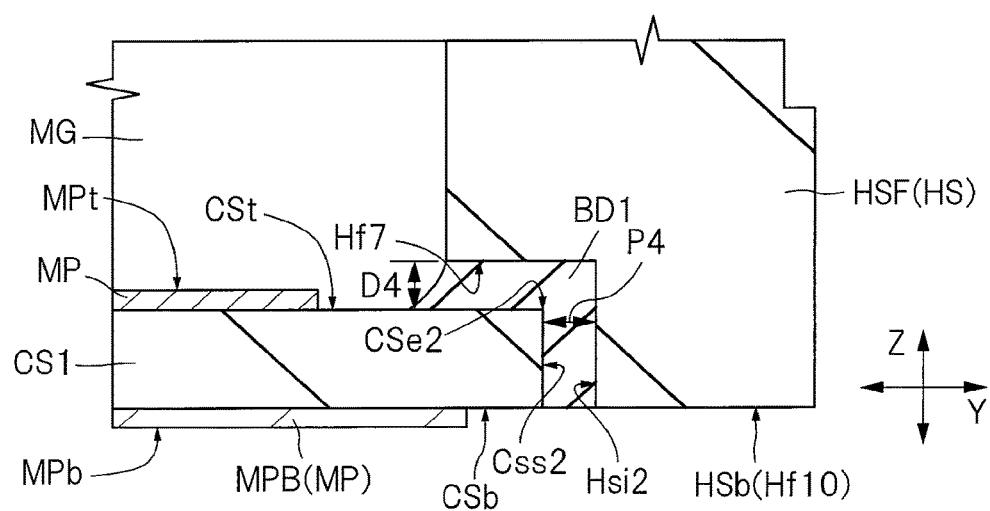
FIG. 20 is an enlarged cross-sectional view enlarging and illustrating a periphery of a stepped surface positioned opposite the stepped surface illustrated in FIG. 19 in the cross-section taken along line A-A of FIG. 18.

Meanwhile, as illustrated in FIG. 18, on the lower surface HSb side of the housing HS of the present embodiment, stepped surfaces Hf5, Hf6, Hf7, and Hf8 are provided to surround the accommodation portion PKT. FIG. 18 is a plan view illustrating the lower surface side of the housing illustrated in FIG. 11. In addition, FIGS. 19 and 20 are enlarged cross-sectional views enlarging and illustrating the periphery of the stepped surface in the cross-section taken along line A-A of FIG. 18. In FIG. 18, in order to indicate a range of each surface that the support portion HSF of the housing HS has, the plurality of surfaces are hatched differently from each other even though FIG. 18 is the plan view. In addition, in FIG. 18, outline of the substrate CS1 illustrated in FIG. 11 is indicated by a dashed line.

As illustrated in FIG. 18, the housing HS has the following sides in a plan view. First, the housing HS has: a side (long side) HSe1 and a side (long side) HSe2 extending in the X direction; and a side (short side) HSe3 and a side (short side) HSe4 extending in the Y direction intersecting with (in FIG. 18, perpendicular to) the X direction on the outermost periphery of the housing HS. In addition, the housing HS has the following sides inside each side of the outermost periphery. That is, the housing HS has: a side (long side) HSe5 extending in the X direction and positioned between the side HSe1 and the side HSe2; and a side (long side) HSe6 extending in the X direction and positioned between the side HSe5 and the side HSe2. In addition, the housing HS has: a side (short side) HSe7 extending in the Y direction and positioned between the side HSe3 and the side HSe4; and a side (short side) HSe8 extending in the Y direction and positioned between the side HSe7 and the side HSe4.

In addition, when seen in a plan view, the substrate CS1 is accommodated in the accommodation portion PKT of the housing HS in the following manner. That is, the side (long side) CSe1 of the substrate CS1 extends along the side HSe1 of the housing HS and is disposed between the side HSe1 and the side HSe5. The side (long side) CSe2 of the substrate CS1 extends along the side HSe2 of the housing HS and is disposed between the side HSe2 and the side HSe6. The side (short side) CSe3 of the substrate CS1 extends along the side HSe3 of the housing HS and is disposed between the side HSe3 and the side HSe7. The side (short side) CSe4 of the substrate CS1 extends along the side HSe4 of the housing HS and is disposed between the side HSe4 and the side HSe8.

In addition, the housing HS has: a lower surface (surface, mounted surface) Hf9 between the side HSe1 and the side CSe1; a lower surface (surface, mounted surface) Hf10 between the side HSe2 and the side CSe2; a lower surface Hf1 between the HSe3 and the side CSe3; and a lower surface Hf3 between the side HSe4 and the side CSe4. Each of these surfaces constitutes the lower surface HSb that is the lowermost surface of the housing HS.

In addition, the housing HS has: a stepped surface (surface, substrate holding surface) Hf5 extending along the X direction and having a portion positioned between the side HSe5 and the side CSe1; and a stepped surface (surface, substrate holding surface) Hf7 extending in the X direction and having a portion positioned between the side HSe6 and the side CSe2. In addition, the housing HS has: a stepped surface (surface, substrate holding surface) Hf6 extending along the Y direction and having a portion positioned between the side HSe7 and the side CSe3; and a stepped surface (surface, substrate holding surface) Hf8 extending in the Y direction and having a portion positioned between the side HSe8 and the side CSe4.

In addition, in the example illustrated in FIG. 18, the housing HS has: stepped surfaces (surfaces, substrate holding surfaces) Hf11, Hf5, and Hf12 arranged in sequence along the X direction and each including the side HSe5; and stepped surfaces (surfaces, substrate holding surfaces) Hf13, Hf7, and Hf14 arranged in sequence along the X direction and each including the side HSe6. Each of the stepped surfaces Hf5, Hf6, Hf7, Hf8, Hf11, Hf12, Hf13, and Hf14 has a portion facing the upper surface CSt (see FIG. 16) of the substrate CS1 in the thickness direction of the substrate CS1.

In other words, a part of the outermost periphery of the upper surface CSt of the substrate CS1 (see FIG. 13) faces any one of the stepped surfaces Hf5, Hf6, Hf7, Hf8, Hf11, Hf12, Hf13, and Hf14 over the entire periphery. In addition, the adhesive material BD1 (see FIG. 16) is interposed between each of the stepped surfaces Hf5, Hf6, Hf7, Hf8, Hf11, Hf12, Hf13, and Hf14 and the upper surface CSt of the substrate CS1 over the entire periphery. As such, when the outermost periphery of the substrate CS1 faces the stepped surfaces over the entire periphery, the substrate CS1 can be stably held.

Here, as illustrated in FIGS. 16 and 17, when the distance D1 and/or the distance D2 increase/increases, it is considered that the distances D3 and D4 illustrated in FIGS. 19 and 20 are the same as the distances D1 and D2 illustrated in FIGS. 16 and 17. However, when the distances D1, D2, D3, and D4 are made equally large values, it has been found that positional accuracy of the substrate CS1 is reduced due to an influence of variations or the like in a coating amount of the adhesive material BD1. For example, in FIG. 18, when the position of the substrate CS1 is closer to the side HSe3 of the housing HS as a whole, the distance P1 illustrated in FIG. 16 becomes narrow and the adhesive material BD1 between the inner surface Hsi3 and the side surface Css3 of the substrate CS1 becomes insufficient. In addition, for example, when the position of the substrate CS1 is closer to the side HSe4 of the housing HS as a whole, the distance P2 illustrated in FIG. 17 becomes narrow and the adhesive material BD1 between the inner surface Hsi4 and the side surface Css4 of the substrate CS1 becomes insufficient. In addition, for example, in a case where the coating amount of the adhesive material BD1 is extremely large in a portion between each of the stepped surfaces Hf5, Hf6, Hf7, and Hf8 and the upper surface CSt of the substrate CS1, the substrate CS1 illustrated in FIG. 18 becomes cause of being accommodated in the accommodation portion PKT in an inclined state. It is preferable that each of the stepped surfaces Hf5, Hf6, Hf7, and Hf8 illustrated in any one of FIG. 16, FIG. 17, FIG. 19, or FIG. 20 and the upper surface CSt of the substrate CS1 are ideally parallel. However, when the substrate CS1 is inclined, each stepped surface does not become parallel to the upper surface CSt of the substrate CS1.

As exemplified, when the positional accuracy of the substrate CS1 in the accommodation portion PKT of the housing HS is reduced, there may be a case where the amount of the adhesive material BD1 is insufficient in a part of a peripheral region of the substrate CS1. If lack of the adhesive material BD1 (see FIG. 16) occurs in the vicinity of the through-hole THH illustrated in FIG. 18, the lack causes the applications of a large external force to the substrate CS1.

Therefore, the inventor of the present application has examined a technique for suppressing the damage to the substrate CS1 and improving the positional accuracy of the substrate CS1 in the accommodation portion PKT of the housing HS. As described above, the damage to the substrate CS1 caused by tightening the screw BOL illustrated in FIG. 14 is easy to occur in the region in the vicinity of the through-hole THH in the longitudinal direction of the housing HS, that is, in the X direction illustrated in FIG. 18. Therefore, the damage to the substrate CS1 hardly occurs in, for example, the stepped surface Hf5 or the stepped surface Hf7 extending in the X direction, regardless of the amount of the adhesive material BD1 (see FIG. 19). The inventor has paid attention to this point and found a technique for improving the positional accuracy of the substrate CS1 in the accommodation portion PKT of the housing HS by intentionally reducing the amount of the adhesive material BD1 in such a region that the damage to the substrate CS1 is difficult to occur even if the amount of the adhesive material BD1 was small.

That is, as can be seen from a comparison of FIG. 16 with FIG. 19, in the electronic device EA1 of the present embodiment, the distance D1 between the upper surface CSt of the substrate CS1 and the stepped surface Hf6 of the housing HS as illustrated in FIG. 16 is larger than the distance D3 between the upper surface CSt of the substrate CS1 and the stepped surface Hf5 of the housing HS as illustrated in FIG. 19. In other words, in the electronic device EA1 of the present embodiment, the height (distance D1) from the upper surface CSt of the substrate CS1 to the stepped surface Hf6 of the housing HS as illustrated in FIG. 16 is greater than the height (distance D3) from the upper surface CSt of the substrate CS1 to the stepped surface Hf5 of the housing HS as illustrated in FIG. 19. Thus, in the case of the electronic device EA1, the distance D3 between the upper surface CSt of the substrate CS1 and the stepped surface Hf5 of the housing HS as illustrated in FIG. 19 becomes small. In the examples illustrated in FIGS. 19 and 20, the distance D3 illustrated in FIG. 19 and the distance D4 illustrated in FIG. 20 have substantially the same degree as the distance P3 illustrated in FIG. 19 and the distance P4 illustrated in FIG. 20, respectively. For example, the degree is about 0.2 mm. In addition, each of the distance D3 illustrated in FIG. 19 and the distance D4 illustrated in FIG. 20 is smaller than the thickness of the substrate CS1 (the distance from one of the upper surface CSt and the lower surface CSb to the other thereof). Therefore, when the substrate CS1 and the housing HS are bonded and fixed, the inclination of the substrate CS1 is difficult to occur. Incidentally, as a modification example relative to the example illustrated in FIG. 19 or 20, the distance D3 or the distance D4 may be further smaller. For example, the distance D3 or the distance D4 may be less than 0.1 mm. In this case, the distance D3 or the distance D4 becomes smaller than the thickness of the metal pattern MP formed on the upper surface CSt of the substrate CS1.

Incidentally, the distance P3 illustrated in FIG. 19 and the distance P4 illustrated in FIG. 20 can be defined as follows. That is, as illustrated in FIG. 19, the support portion HSF of the housing HS has an inner surface Hsi1 which is continuous with the lower surface Hf9 of the housing HS and whose part faces the side surface (long side surface) Css1 of the substrate CS1. In the example illustrated in FIG. 19, the inner surface Hsi1 is continuous with each of the lower surface Hf9 and the stepped surface Hf5. In addition, as illustrated in FIG. 20, the support portion HSF of the housing HS has an inner surface Hsi2 which is continuous with the lower surface Hf10 of the housing HS and whose part faces the side surface (long side surface) Css2 of the substrate CS1. In the example illustrated in FIG. 20, the inner surface Hsi2 is continuous with each of the lower surface Hf10 and the stepped surface Hf7. Here, the distance P3 illustrated in FIG. 19 is an interval between the inner side surface Hsi1 and the side surface Css1 of the substrate CS1. In addition, the distance P4 illustrated in FIG. 20 is an interval between the inner side surface Hsi2 and the side surface Css2 of the substrate CS1. From the viewpoint of reducing the mounting area of the electronic device EA1, it is preferable that the distance P3 and the distance P4 are as small as possible. In the present embodiment, each of the distance P3 and the distance P4 has the same value as the distance P1 illustrated in FIG. 16 and the distance P2 illustrated in FIG. 17.

In addition, as illustrated in FIG. 18, the stepped surface Hf5 is separated from each of the stepped surface Hf6 and the stepped surface Hf8. In other words, in the X direction, the stepped surface Hf11 is disposed between the stepped surface Hf6 and the stepped surface Hf5. Therefore, the distance from the through-hole THH to the stepped surface Hf5 is remote. For example, the cross-section illustrated in FIG. 19 is a cross-section taken along a virtual line connecting the center of the side HSe1 and the center of the side HSe5 of the housing HS. Therefore, the stepped surface Hf5 is positioned in a middle of the two through-holes THH in the X direction. In other words, the stepped surface Hf5 includes a midpoint of the side HSe5 of the housing HS. Thus, the influence of the external force EF1 described with reference to FIG. 14 is small even when the value of the distance D3 illustrated in FIG. 19 is made small at a position where the distance from the through-hole THH is remote. Therefore, even when the distance D3 illustrated in FIG. 19 is small, the damage to the substrate CS1 is difficult to occur.

In addition, as illustrated in FIG. 16, the distance D1 between the upper surface CSt of the substrate CS1 and the stepped surface Hf6 of the housing HS increases at the stepped surface Hf6 disposed at a position close to the through-hole THH illustrated in FIG. 18. Therefore, even when the screw BOL (see FIG. 14) is inserted into the through-hole THH (see FIG. 18) and then tightened, the external force EF1 (see FIG. 14) applied from the vicinity of the stepped surface Hf6 illustrated in FIG. 16 to the vicinity of the side CSe3 of the substrate CS1 can be dispersed, and so the damage to the substrate CS1 can be suppressed.

In addition, the configurations comparing FIG. 16 with FIG. 19 have been described in the above, but the structure around the stepped surface Hf6 illustrated in FIG. 16 is similar to the structure around the stepped surface Hf8 illustrated in FIG. 17. In addition, the structure around the stepped surface Hf5 illustrated in FIG. 19 is similar to the structure around the stepped surface Hf7 illustrated in FIG. 20. Therefore, although repeated descriptions regarding all the configurations are omitted, the same relationship is established in the comparison between FIG. 16 and FIG. 20, the comparison of FIG. 17 with FIG. 19, or the comparison between FIG. 17 and FIG. 20. For example, as can be seen from the comparison between FIG. 17 and FIG. 19, in the electronic device EA1 of the present embodiment, the distance D2 between the upper surface CSt of the substrate CS1 and the stepped surface Hf8 of the housing HS illustrated in FIG. 17 is larger than the distance D3 between the upper surface CSt of the substrate CS1 and the stepped surface Hf5 of the housing HS illustrated in FIG. 19. Therefore, even when the screw BOL (see FIG. 14) is inserted into the through-hole THH (see FIG. 18) and then tightened, the external force EF1 (see FIG. 14) applied from the vicinity of the stepped surface Hf8 illustrated in FIG. 17 to the vicinity of the side CSe4 of the substrate CS1 can be dispersed, and so the damage to the substrate CS1 can be suppressed.

In addition, for example, as can be seen from the comparison of FIG. 16 with FIG. 20, in the electronic device EA1 of the present embodiment, the distance D1 between the upper surface CSt of the substrate CS1 and the stepped surface Hf6 of the housing HS illustrated in FIG. 16 is larger than the distance D4 between the upper surface CSt of the substrate CS1 and the stepped surface Hf7 of the housing HS illustrated in FIG. 20. Therefore, when the substrate CS1 is disposed in the accommodation portion PKT of the housing HS (see FIG. 18), the upper surface CSt of the substrate CS1 is supported by both of the stepped surface Hf5 and the stepped surface Hf7 illustrated in FIG. 18. In this manner, the posture of the substrate CS1 is stabilized by supporting the substrate CS1 at a plurality of positions separated from each other. In other words, it is easy to control an angle formed between each of the plurality of stepped surfaces of the housing HS and the upper surface CSt of the substrate CS1. Therefore, the plurality of stepped surfaces of the housing HS and the upper surface CSt of the substrate CS1 are disposed to face each other in a substantially parallel state (a state that can be regarded as being substantially parallel). In this case, as illustrated in FIG. 11, when seen in a plan view from the lower surface CSb side of the substrate CS1, the center point of the lower surface CSb of the substrate CS1 substantially coincides with the center point of the accommodation portion PKT. In addition, when seen in a plan view from the lower surface CSb side of the substrate CS1, the intervals between the substrate CS1 and the housing HS (the distance P1 illustrated in FIG. 16, the distance P2 illustrated in FIG. 17, the distance P3 illustrated in FIG. 19, and the distance P4 illustrated in FIG. 20) have substantially the same value, and so the variation in the amount of the adhesive material BD1 can be reduced.

Figure 21:
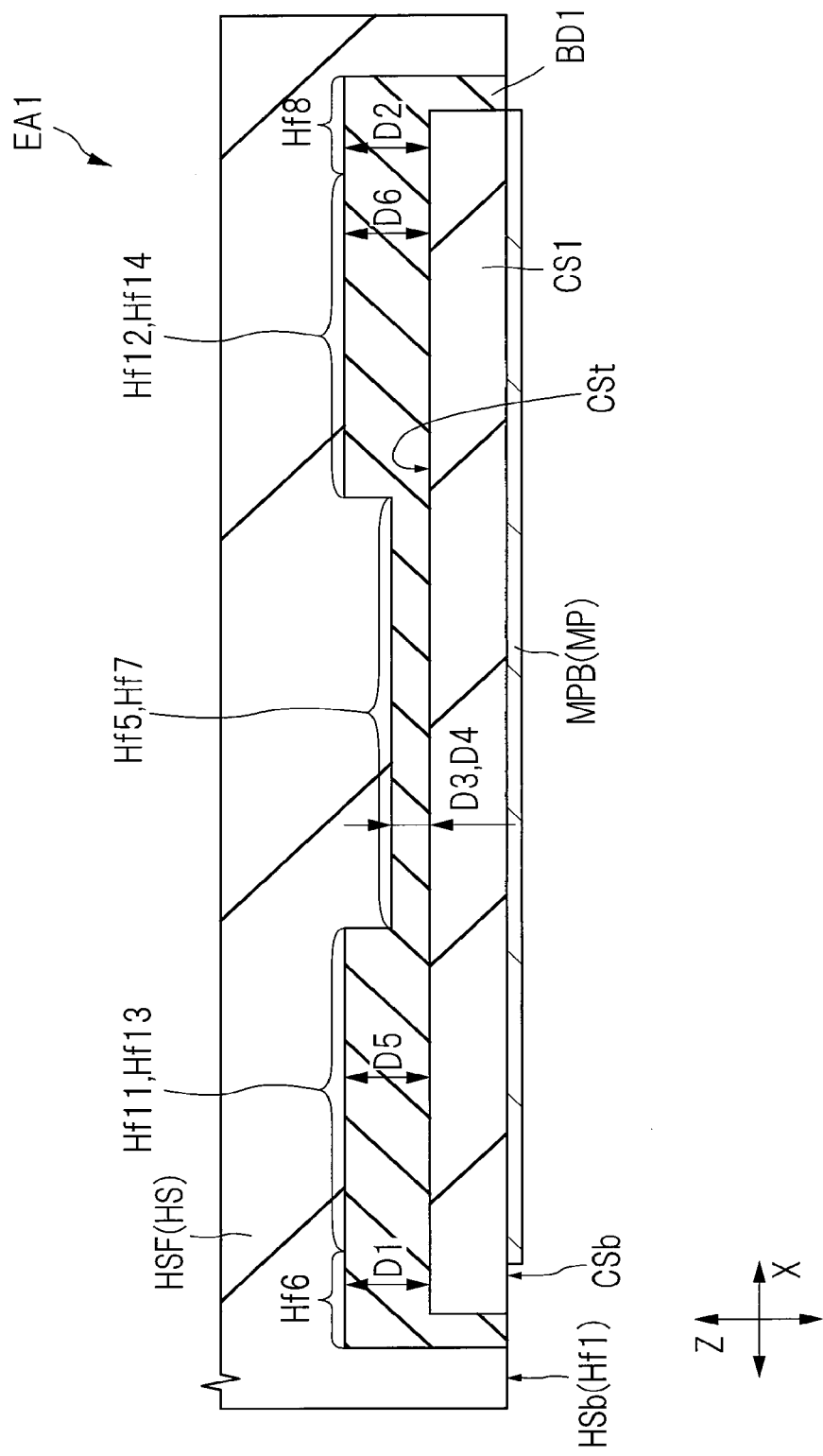
FIG. 21 is an enlarged cross-sectional view illustrating a relationship between a stepped surface and a substrate in a cross-section taken along line B-B of FIG. 18.

In addition, the stepped surface arranged in the long side direction among the plurality of stepped surfaces illustrated in FIG. 18 has, for example, the structure illustrated in FIG. 21. FIG. 21 is an enlarged cross-sectional view showing the relationship between the stepped surface and the substrate in the cross-section taken along line B-B of FIG. 18. Incidentally, although FIG. 21 is an enlarged cross-sectional view of the stepped surface having the side HSe5 in FIG. 18, the structure of the stepped surface having the side HSe6 illustrated in FIG. 18 is also the same. Thus, in FIG. 21, reference symbols of the stepped surface having the side HSe6 are also added. In addition, in the following description, the structure of the stepped surface having the side HSe5 in FIG. 18 will be described, but a description about the structure of the stepped surface having the side HSe6 indicated by parentheses ( ) in FIG. 18 is also given.

As illustrated in FIG. 21, the housing HS has a stepped surface Hf11 (or a stepped surface Hf13) positioned between the stepped surface Hf6 and the stepped surface Hf5 (or the stepped surface Hf7) in the X direction and facing the upper surface CSt of the substrate CS1 through the adhesive material BD1 in the Z direction. In addition, the distance D5 between the upper surface CSt of the substrate CS1 and the stepped surface Hf11 (or the stepped surface Hf13) of the housing HS is larger than the distance D3 (or the distance D4) between the upper surface CSt of the substrate CS1 and the stepped surface Hf5 (or the stepped surface Hf7) of the housing HS. In addition, in the example illustrated in FIG. 21, the stepped surface Hf11 (or the stepped surface Hf13) is continuous with the stepped surface Hf6, and the distance D5 has the same value as the distance D1. Therefore, a sufficient amount of the adhesive material BD1 is disposed between the upper surface CSt of the substrate CS1 and the stepped surface Hf11 (or the stepped surface Hf13) disposed at the position closest to the stepped surface Hf6 on the short-side side among the plurality of stepped surfaces having the side HSe5 (or the side HSe6) illustrated in FIG. 18.

In addition, the housing HS has a stepped surface Hf12 (or a stepped surface Hf14) positioned between the stepped surface Hf8 and the stepped surface Hf5 (or the stepped surface Hf7) in the X direction and facing the upper surface CSt of the substrate CS1 through the adhesive material BD1 in the Z direction. In addition, the distance D6 between the upper surface CSt of the substrate CS1 and the stepped surface Hf12 (or the stepped surface Hf14) of the housing HS is larger than the distance D3 (or the distance D4) between the upper surface CSt of the substrate CS1 and the stepped surface Hf5 (or the stepped surface Hf7) of the housing HS. In addition, in the example illustrated in FIG. 21, the stepped surface Hf12 (or the stepped surface Hf14) is continuous with the stepped surface Hf8, and the distance D6 has the same value as the distance D2. Therefore, a sufficient amount of the adhesive material BD1 is disposed between the upper surface CSt of the substrate CS1 and the stepped surface Hf12 (or the stepped surface Hf14) disposed at the position closest to the stepped surface Hf8 on the short-side side among the plurality of stepped surfaces having the side HSe5 (or the side HSe6) illustrated in FIG. 18.

<Method of Manufacturing Electronic Device>

Figure 22:
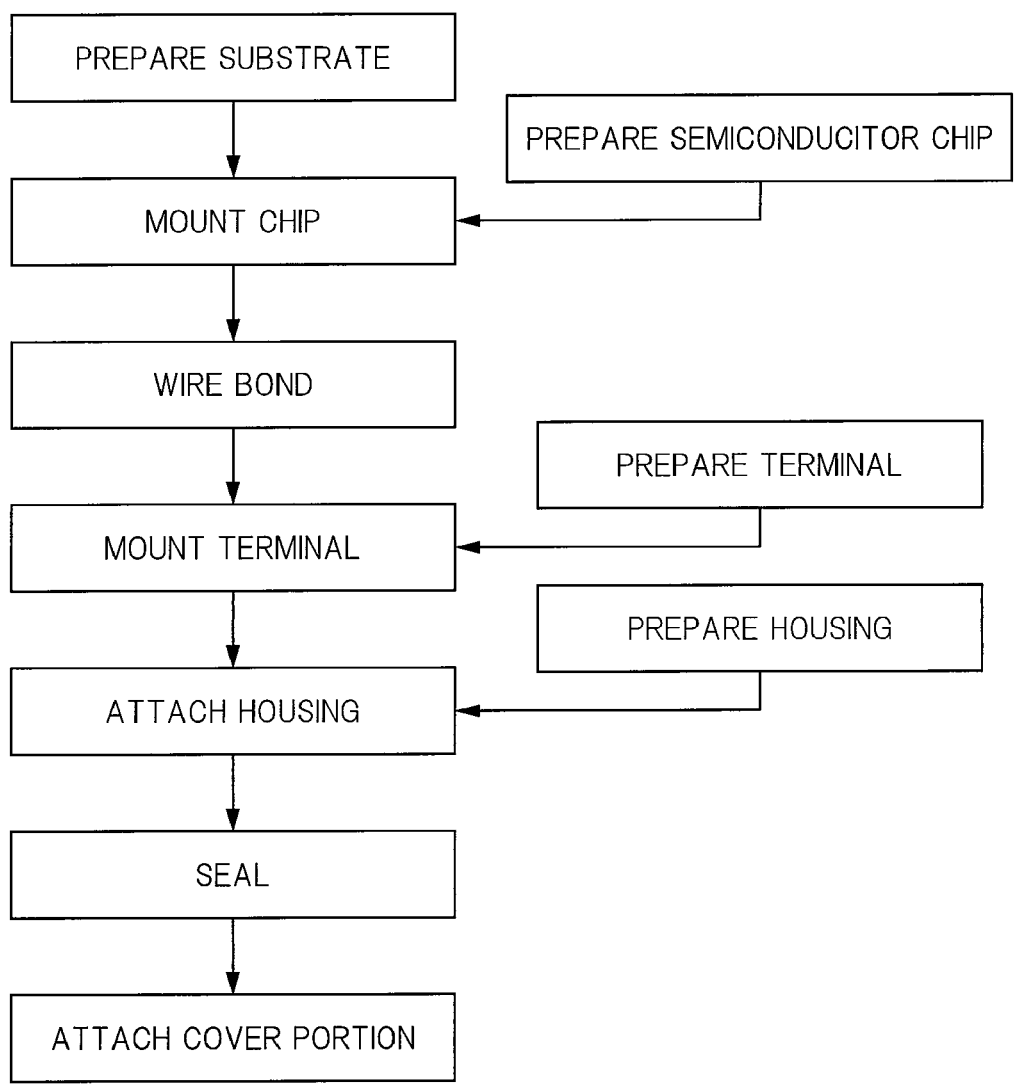
FIG. 22 is an explanatory diagram illustrating an assembling flow of the electronic device illustrated in FIG. 10.

Next, a process of manufacturing the electronic device EA1 described with reference to FIGS. 1 to 21 will be described along with a process flow illustrated in FIG. 22. FIG. 22 is an explanatory diagram illustrating an assembling flow of the electronic device illustrated in FIG. 13.

<Preparing of Substrate>

Figure 23:
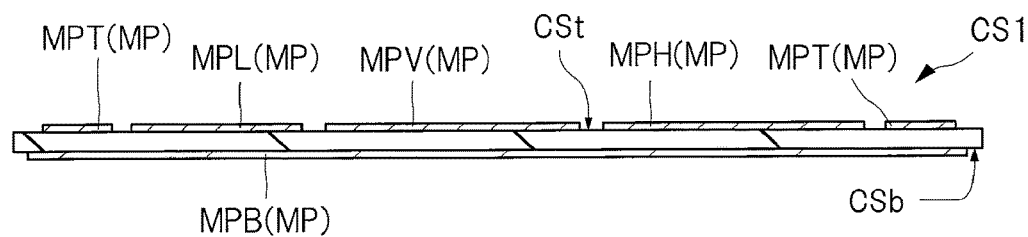
FIG. 23 is a cross-sectional view of a substrate prepared in a substrate preparing step illustrated in FIG. 22.

First, in a substrate preparing step illustrated in FIG. 22, a substrate CS1 illustrated in FIG. 23 is prepared. FIG. 23 is a cross-sectional view of the substrate prepared in the substrate preparing step illustrated in FIG. 22. Incidentally, FIG. 23 corresponds to the cross-section taken along line A-A illustrated in FIG. 11.

The substrate CS1 prepared in this process has: an upper surface (front surface, main surface, surface) CSt as a chip mounting surface on which a plurality of semiconductor chips SC1 are mounted; and a lower surface (back surface, main surface, surface) CSb positioned opposite the upper surface CSt. The substrate CS1 is a ceramic substrate made of a ceramic material.

In addition, a plurality of metal patterns MP are bonded to the upper surface CSt and the lower surface CSb of the substrate CS1. The plurality of metal patterns MP are, for example, a laminated film in which a nickel (Ni) film is laminated on a surface of a copper (Cu) film(s), and the copper film is directly bonded to the upper surface CSt or the lower surface CSb of the substrate CS1. In a case where the copper film is bonded to a plate member made of ceramic such as alumina, the copper film and the plate member are bonded to each other by using a eutectic reaction. In addition, as a method of laminating the nickel film on the surface of the copper film, for example, an electroplating method can be used.

Incidentally, since the type and layout of the plurality of metal patterns MP are the same as those described above, repeated descriptions thereof will be omitted.

<Mounting of Chips>

Figure 24:
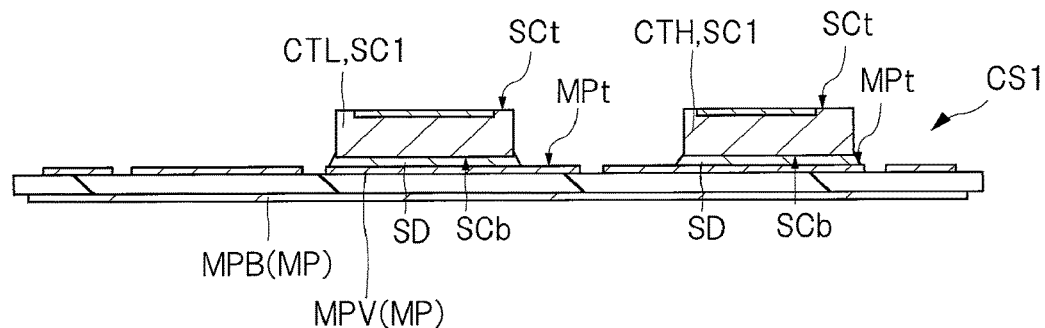
FIG. 24 is across-sectional view illustrating a state in which a plurality of semiconductor chips are mounted on the substrate illustrated in FIG. 23.

Next, in a chip mounting step illustrated in FIG. 22, a plurality of semiconductor chips SC1 are mounted on the metal patterns MP of the substrate CS1 as illustrated in FIG. 24. FIG. 24 is a cross-sectional view illustrating a state in which the plurality of semiconductor chips are mounted on the substrate illustrated in FIG. 23.

In this step, as described with reference to FIG. 13, a plurality of semiconductor chips SCH (three semiconductor chips in the present embodiment) and a plurality of semiconductor chips SC2 (three semiconductor chips in the present embodiment) are mounted on the metal pattern MPH, to which a potential E1 on a high-side side (see FIG. 3) is supplied, among the plurality of metal patterns MP. In addition, one semiconductor chip SC1 and one semiconductor chip SC2 are mounted on each of the metal patterns MPU, MPV, and MPW, which are connected to an AC power output terminal, among the plurality of metal patterns MP. In addition, the semiconductor chip SC1 is not mounted on the metal pattern MPL, to which a potential E2 on a low-side side (see FIG. 3) is supplied, among the plurality of metal patterns MP. In addition, the semiconductor chips SC1 and SC2 are not mounted on the plurality of metal patterns MPT for connecting input/output terminals LD among the plurality of metal patterns MP.

In addition, as illustrated in FIG. 24, in this step, each of the semiconductor chips SC1 and SC2 (see FIG. 13) is mounted by a so-called face-up mounting method in a state in which back surfaces SCb of the semiconductor chips SC1 and SC2 and upper surfaces MPt of the metal patterns MP face each other. In addition, a collector electrode CP (see FIG. 5) is formed on the back surface SCb of the semiconductor chip SC1, and a cathode electrode CDP (see FIG. 8) is formed on the back surface SCb of the semiconductor chip SC2. In order to electrically connect the collector electrode CP or the cathode electrode CDP and the metal pattern MP, the semiconductor chips SC1 and SC2 are mounted through a conductive adhesive material (a die bonding material, a conductive member, a connecting member, a bonding material) SD. In the present embodiment, as the conductive adhesive material SD, an example using solder will be described as an example.

A method of mounting the semiconductor chips SC1 and SC2 (see FIG. 13) through the conductive adhesive material SD as solder is performed as follows. First, paste-like solder is coated in a region planning to mount the semiconductor chip. A solder component and a flux component are included in the paste-like solder. Next, the plurality of semiconductor chips SC1 and SC2 (see FIG. 13) are prepared (semiconductor chip preparing step illustrated in FIG. 22) and are each pressed onto the paste-like solder. A reflow process (heating process) is performed onto the solder in a state in which the plurality of semiconductor chips SC1 are temporarily bonded on the metal patterns MP through the paste-like solder. The reflow process is performed within, for example, a heating furnace under a vacuum state (reduced pressure state) (such a reflow process is called a vacuum reflow process). The solder is melted by the reflow process so that one thereof is bonded to the metal pattern MP and the other is bonded to the electrodes of the back surfaces SCb of the semiconductor chips SC1 and SC2. Then, when the solder is cured by cooling, each of the semiconductor chips SC1 is fixed onto the metal pattern MP. In addition, after that, a residue of the flux component may remain around the cured conductive adhesive material SD, so that the substrate CS1 is cleaned to remove the residue.

Incidentally, besides the semiconductor chips SC1 and SC2, in the case of mounting chip components (electronic components, functional elements) other than the semiconductor chips SC1, such as capacitors, they can be collectively mounted in this step.

In addition, the above is an example of the chip mounting step, and various modification examples can be applied. A state of bonding portions between the semiconductor chips SC1 and SC2 and the metal patterns MP may be inspected by, for example, non-destructive inspection.

<Wire Bonding>

Figure 25:
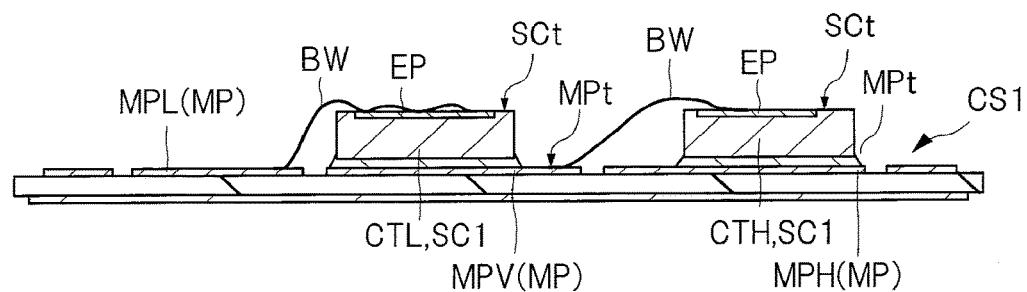
FIG. 25 is a cross-sectional view illustrating a state after wires are connected to the semiconductor chips illustrated in FIG. 24.

Next, in a wire bonding step illustrated in FIG. 22, as illustrated in FIG. 25, the semiconductor chips SC1 and the metal patterns MP are electrically connected to each other through wires (conductive members) BW. FIG. 25 is a cross-sectional view illustrating a state after the wires are connected to the semiconductor chips illustrated in FIG. 24.

As described with reference to FIG. 13, in this step, an emitter electrode EP of the semiconductor chip SCH for the high side (see FIG. 4) is connected to any one of a metal pattern MPU, a metal pattern MPV, and a metal pattern MPW through the plurality of wires BW. In addition, an emitter electrode EP of a semiconductor chip SCL for a low side is connected to a metal pattern MPL through a plurality of wires BW. In addition, each of gate electrodes GP (see FIG. 4) included in each of the semiconductor chip SCH for the high side and the semiconductor chip SCL for the low side is electrically connected to the metal pattern MPT through a wire BW.

In addition, an anode electrode ADP of the semiconductor chip SC2 for the high side (see FIG. 7) is connected to any one of the metal pattern MPU, the metal pattern MPV, and the metal pattern MPW, and to an output metal pattern MPT through a plurality of wires BW. In addition, the anode electrode ADP of the semiconductor chip SC2 for the low side is connected to the metal pattern MPL through a plurality of wires BW.

The plurality of wires BW illustrated in FIG. 13 are metal wires. In the present embodiment, each wire BW is made of, for example, aluminum. However, there are various modification examples about the material of the wire BW. In addition to aluminum, gold or copper can be used. Incidentally, in the present embodiment, the example in which the wire is used as the member for electrically connecting the semiconductor chip SC1 and the metal pattern MP has been described, but a band-shaped metal (for example, an aluminum ribbon) can be used as a modification example. In addition, alternatively, the semiconductor chip SC1 and the metal pattern MP can be connected to each other through solder by using a patterned metal plate (copper clip).

In addition, the above is an example of the wire bonding step, and various modification examples can be applied. For example, a state of a bonding portion(s) between the wire BW and the bonded part may be inspected.

<Mounting of Terminals>

Figure 26:
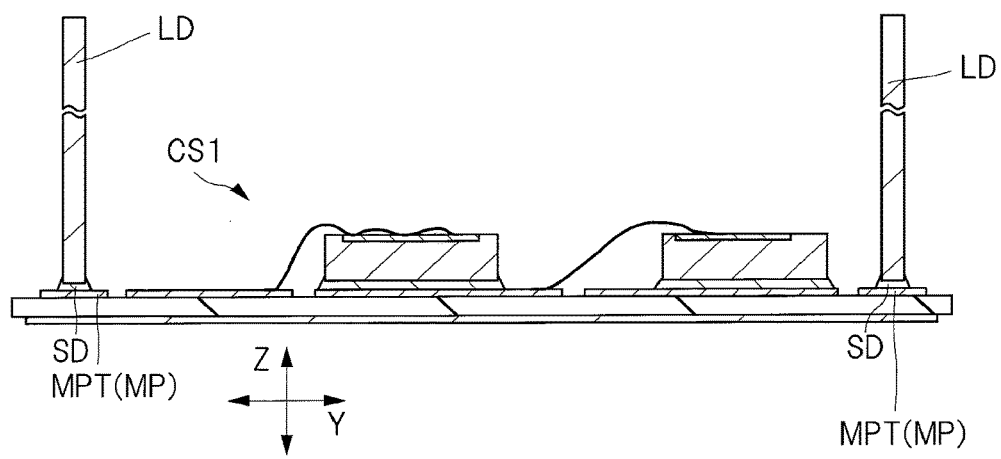
FIG. 26 is across-sectional view illustrating a state in which a plurality of terminals are mounted on the substrate illustrated in FIG. 25.

Next, in a terminal mounting step illustrated in FIG. 22, as illustrated in FIG. 26, terminals LD are mounted on the plurality of metal patterns MP. FIG. 26 is a cross-sectional view illustrating a state in which a plurality of terminals are mounted on the substrate illustrated in FIG. 25. The terminal LD is a lead terminal for electrically connecting the plurality of patterns to an external device(s) (not illustrated), and its one end slenderly extending is connected to the metal pattern MP. In the example illustrated in FIG. 25, each of the plurality of terminals LD is mounted on the metal pattern MP through the conductive adhesive material SD.

In addition, in the example illustrated in FIG. 13, the terminals LD are mounted on both longitudinal-directional ends (on sides of the side CSe3 and side CSe4 as short sides) in the metal pattern MPH, to which the potential on the high-side side is supplied, and in the metal pattern MPL, to which the potential on the low-side side is supplied, among the plurality of metal patterns MP. In addition, one terminal LD is mounted on each of the plurality of metal patterns MPT. In addition, the terminal LD is not directly connected to each of the metal pattern MPU, the metal pattern MPV, and the metal pattern MPW.

Incidentally, although omitted and not illustrated in FIG. 26, in a case where the plurality of terminals LD are collectively connected, it is preferable to use a jig(s) (not illustrated) for holding the plurality of terminals LD. For example, if the plurality of terminals LD are connected to each other through a frame (s) (not illustrated), the plurality of terminals LD can be collectively held by using the jig and holding the frame. In this case, after the plurality of terminals LD are connected, each of the plurality of terminals LD is separated by cutting the frame.

<Attaching of Housing>

Figure 27:
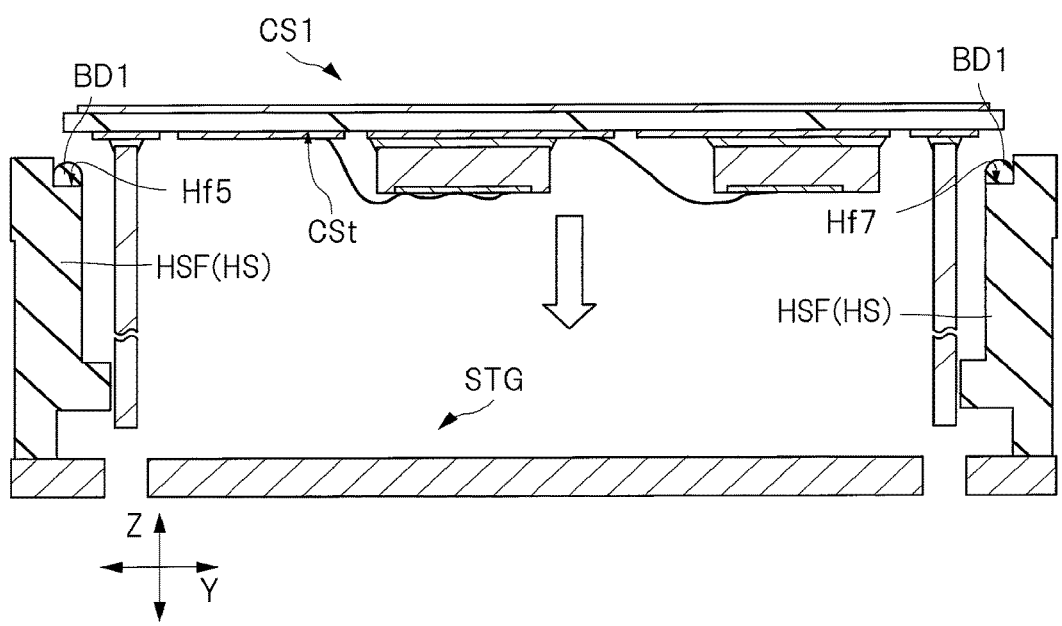
FIG. 27 is a cross-sectional view schematically illustrating a step of attaching a housing to the substrate illustrated in FIG. 26.

Next, in a housing attaching step illustrated in FIG. 22, as illustrated in FIG. 27, a housing HS is attached so as to surround the periphery of the substrate CS1, and the substrate CS1 and the housing HS are fixed through an adhesive material BD1. FIG. 27 is a cross-sectional view schematically illustrating a step of attaching the housing to the substrate illustrated in FIG. 26. In this step, a support portion HSF of the housing HS is bonded and fixed so as to cover a peripheral portion of the upper surface CSt of the substrate CS1. The peripheral portion of the upper surface CSt of the substrate CS1 and the support portion HSF of the housing HS are bonded and fixed to each other through the adhesive material BD1.

In addition, in this step, as illustrated in FIG. 27, it is preferable to attach the substrate CS1 to the housing HS in a state in which the substrate CS1 is inversed up and down in the Z direction. That is, in the example illustrated in FIG. 27, the housing HS is fixed to a support table STG in a state in which the stepped surfaces Hf5 and Hf7 of the housing HS face upward. Next, the adhesive material BD1 is coated on the stepped surfaces Hf5 and Hf7 of the housing HS. Incidentally, a state in which the adhesive material BD1 is coated on the stepped surfaces Hf5 and Hf7 of the housing HS is representatively illustrated in FIG. 27. However, in this step, the adhesive material BD1 is coated on each of the stepped surfaces Hf5, Hf6, Hf7, Hf8, Hf11, Hf12, Hf13, and Hf14 illustrated in FIG. 18.

Next, as schematically illustrated with a void arrow in FIG. 27, the upper surface CSt of the substrate CS1 is pressed toward the support portion HSF of the housing HS. Therefore, the adhesive material BD1 applied to each stepped surface deforms and spreads between the substrate CS1 and the stepped surface of the housing HS. When the adhesive material BD1 is cured in this state, the stepped surface of the peripheral portion of the upper surface CSt of the substrate CS1 and the support portion HSF of the housing HS are bonded and fixed to each other through the adhesive material BD1.

According to the method of the present embodiment, since the adhesive material BD1 is coated in a state in which each stepped surface faces upward, the adhesive material BD1 is difficult to spread around even when the viscosity of the adhesive material BD1 is low. In other words, a degree of freedom in material selection of the adhesive material BD1 is high. In addition, when the viscosity of the adhesive material BD1 before curing is low, the adhesive material BD1 is easy to wet and spread easily when the substrate CS1 is pressed against the housing HS. In this case, a gap(s) or a void(s) is difficult to remain between each stepped surface and the substrate CS1 illustrated in FIG. 18. That is, according to the present embodiment, it is easy to control the amount of the adhesive material BD1 interposed between the substrate CS1 and the housing HS.

As described with reference to FIG. 14, when the electronic device EA1 is mounted, the adhesive material BD1 has a function of dispersing the external force EF1 transmitted from the housing HS to the substrate CS1. The damage to the substrate CS1 can be stably suppressed by controlling the amount of the adhesive material BD1 interposed between the substrate CS1 and the housing HS.

<Sealing>

Next, in a sealing step illustrated in FIG. 22, as illustrated in FIG. 12, a sealing material MG is supplied to a space surrounded by the substrate CS1 and the housing HS, and seals: a part of each of the plurality of terminals LD; the plurality of semiconductor chips SC1; and the plurality of wires BW. In the present embodiment, the sealing step is performed in a state in which a cover portion (cover member, cap) HST illustrated in FIG. 12 is not attached. In addition, as illustrated in FIG. 27, an opening is provided inside the support portion HSF of the housing HS. Therefore, in the present embodiment, a gel-like sealing material MG is filled from the opening to seal the plurality of semiconductor chips SC1 and SC2 and the plurality of wires BW illustrated in FIG. 13.

In addition, like the present embodiment, if there is a gap (s) in the bonding portion between the support portion HSF of the housing HS and the substrate CS1 (a contact interface between the adhesive material BD1 and the substrate CS1 or housing HS) in a case of using the gel-like sealing material MG having relatively high fluidity, there is also a possibility that the sealing material MG will leak from the gap. Therefore, from the viewpoint of preventing leakage of the sealing material MG, it is preferable that the interval between the upper surface CSt of the substrate CS1 and each stepped surface illustrated in FIG. 18 is small. Thus, regarding the stepped surface having a large interval with the upper surface CSt of the substrate CS1 among the respective stepped surfaces illustrated in FIG. 18, it is preferable to reduce the interval between the above stepped surface and the substrate CS1, similarly to the distance D3 illustrated in FIG. 19 or the distance D4 illustrated in FIG. 2, in a portion in which an influence on the damage to the substrate SC1 is small and that has been described by using FIG. 14 and FIG. 15.

In addition, as described above, in the housing attaching step, if the viscosity of the adhesive material BD1 before its curing is low, the adhesive material makes it easy to wet and spread widely, so that a gap (s) makes it difficult to occur in the bonding portion between the support portion HSF of the housing HS and the substrate CS1 (the contact interface between the adhesive material BD1 and the substrate CS1 or housing HS).

<Attaching of Cover Portion>

Next, in the sealing step illustrated in FIG. 22, a cover portion HST is attached to an upper portion of the housing HS to cover a region sealed with the sealing material MG, as illustrated in FIG. 12. Since the region sealed with the sealing material MG is covered by the cover portion HST, it is possible to prevent foreign matters from entering etc. the space inside the housing HS. A plurality of through-holes are formed in the cover portion HST of the housing HS, and the plurality of terminals LD are respectively inserted into the plurality of through-holes (not illustrated).

The cover portion HST and the support portion HSF are fixed through, for example, an adhesive material (not illustrated). Alternatively, the cover portion HST may be placed on the accommodation portion PKT (see FIG. 12) of the support portion HSF without interposing an adhesive material. If a position of the cover portion HST is not shifted on the support portion HSF, it is possible to prevent foreign matters from entering the space inside the housing HS even though the cover portion HST is not perfectly fixed.

The electronic device EA1 described with reference to FIGS. 3 to 21 can be obtained by the above-described step. After that, necessary inspections and tests such as appearance inspections or electrical tests are performed and then shipped. In addition, the electronic device EA1 is mounted on the substrate BP1 illustrated in FIG. 14. As a modification example relative to FIG. 22, a method including the manufacturing method illustrated in FIG. 22 and the step of mounting the electronic device EA1 on the substrate BP1 illustrated in FIG. 14 can be considered as a method of manufacturing the electronic device.

In the foregoing, the invention made by the inventor of the present invention has been concretely described based on the embodiments. However, it is needless to say that the present invention is not limited to the foregoing embodiments and various modifications and alterations can be made within the scope of the present invention. Incidentally, some modification examples have been described in the embodiments, but representative modification examples other than the modification examples in the above embodiments will be described below.

First Modification Example

Figure 28:
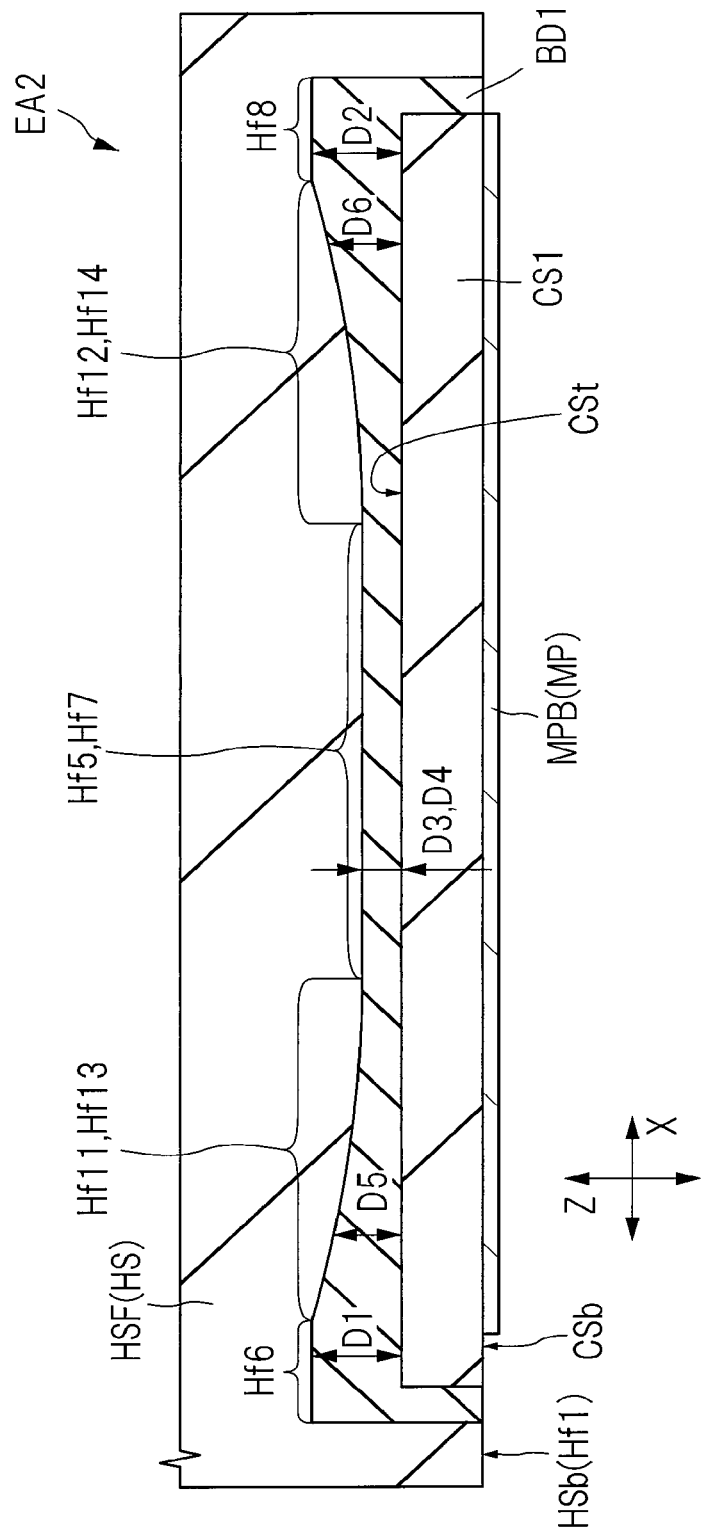
FIG. 28 is an enlarged cross-sectional view illustrating a modification example relative to FIG. 21.
Figure 29:
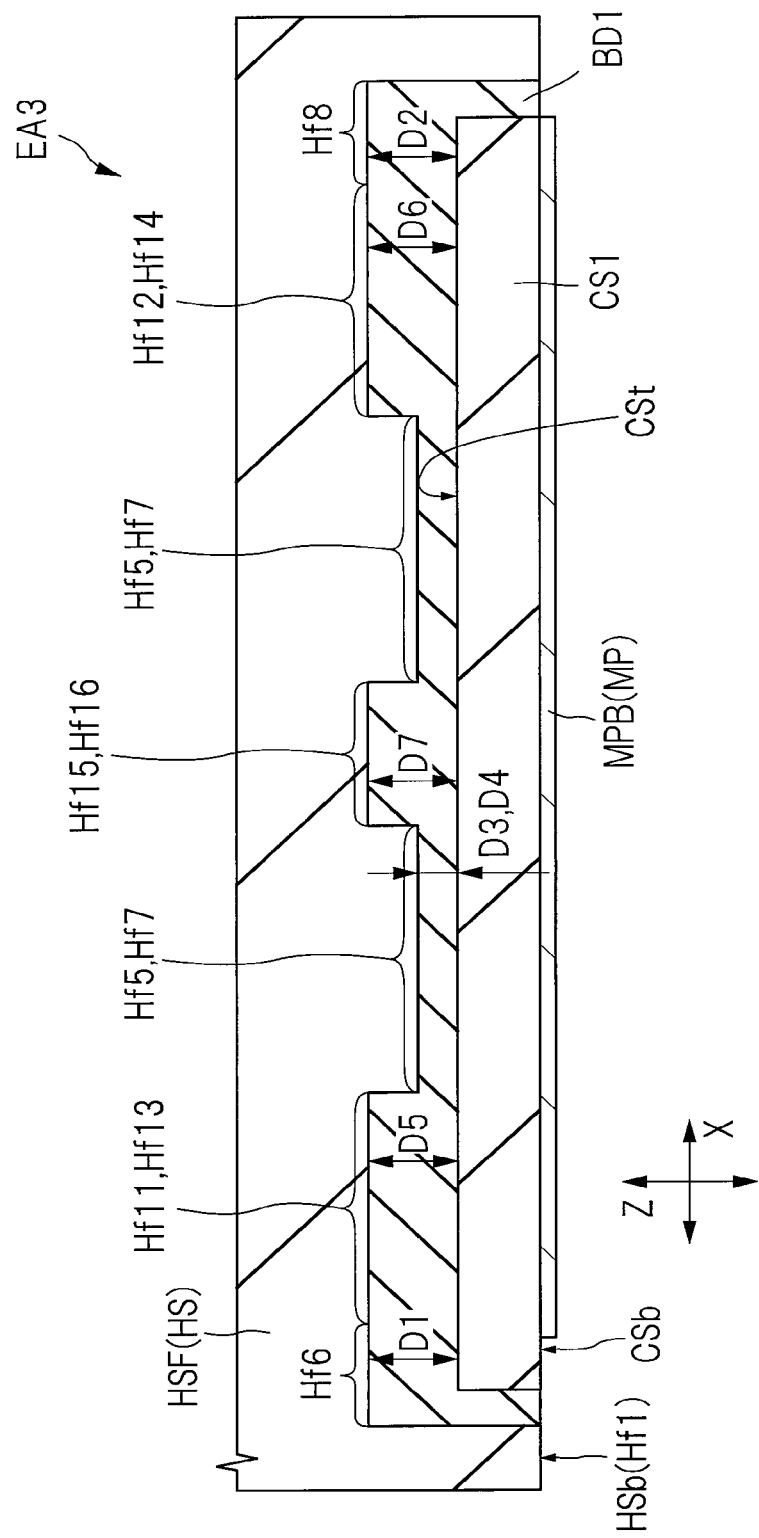
FIG. 29 is an enlarged cross-sectional view illustrating another modification example relative to FIG. 21.

For example, in the above embodiment, the structural example of the stepped surface along the side HSe5 and the stepped surface along the side HSe6 illustrated in FIG. 18 has been described with reference to FIG. 21, but there are various modification examples. FIGS. 28 and 29 are enlarged cross-sectional views illustrating a modification example relative to FIG. 21.

Each of an electronic device EA2 illustrated in FIG. 28 and an electronic device EA3 illustrated in FIG. 29 differs from the electronic device EA1 illustrated in FIG. 21 in terms of shapes of the stepped surface extending along the longitudinal direction of the housing HS.

The housing HS included in the electronic device EA2 illustrated in FIG. 28 has a stepped surface Hf11 (or a stepped surface Hf13) that is positioned between a stepped surface Hf6 and a stepped surface Hf5 (or a stepped surface Hf7) in an X direction and that faces an upper surface CSt of a substrate CS1 through an adhesive material BD1 in a Z direction. The stepped surface Hf11 (or the stepped surface Hf13) is a curved surface extending in the X direction so as to connect the stepped surface Hf5 (or the stepped surface Hf7) and the stepped surface Hf6.

In addition, the housing HS has a stepped surface Hf12 (or a stepped surface Hf14) that is positioned between a stepped surface Hf8 and the stepped surface Hf5 (or the stepped surface Hf7) in the X direction and that faces the upper surface CSt of the substrate CS1 through the adhesive material BD1 in the Z direction. The stepped surface Hf12 (or the stepped surface Hf14) is a curved surface extending in the X direction so as to connect the stepped surface Hf5 (or the stepped surface Hf7) and the stepped surface Hf8.

In the case of the electronic device EA2, values of a distance D5 and a distance D6 gradually change. In other words, there is no inflection point where the distance D5 (or the distance D6) sharply changes in a path from the stepped surface Hf6 (or the stepped surface Hf8) to the stepped surface Hf5 (or the stepped surface Hf7). For this reason, when a flange portion FLG (see FIG. 14) of the housing HS is deformed, it is difficult to locally apply a strong force.

Incidentally, although omitted and not illustrated, as a modification example relative to FIG. 28, each of the stepped surfaces Hf11, Hf12, Hf13, and Hf14 may be an inclined surface that is inclined with respect to a reference surface parallel to the stepped surface Hf5. In this case, as compared with the electronic device EA1 illustrated in FIG. 21, a place (s) where a strong force is locally applied is difficult to occur when the flange portion FLG (see FIG. 14) of the housing HS is deformed. However, the curved surface as illustrated in FIG. 28 is more preferable because there is a possibility that a force applied to a portion where the inclined surface intersects with a horizontal plane will become stronger than that of the other portions.

In addition, although omitted and not illustrated, even in the case of the electronic device EA2 illustrated in FIG. 28 similarly to the case of the electronic device EA1 illustrated in FIG. 21, the stepped surface Hf5 (or the stepped surface Hf7) is positioned in the middle of two through-holes THH (see FIG. 18) in the X direction. 21. In other words, the stepped surface Hf5 (or the stepped surface Hf7) illustrated in FIG. 18 includes the midpoint of the side HSe5 (or the side HSe6) of the housing HS.

In addition, the housing HS included in the electronic device EA3 illustrated in FIG. 29 has: a plurality of stepped surfaces Hf5 that are positioned between the side HSe5 (see FIG. 18) and the side CSe1 of the substrate CS1 (see FIG.

18) in the Y direction (see FIG. 18) and that face the upper surface CSt of the substrate CS1 through the adhesive material BD1 in the Z direction; and a stepped surface (surface, substrate holding surface) Hf15 placed so as to be sandwiched between the plurality of stepped surfaces Hf5. In addition, the housing HS has: a plurality of stepped surfaces Hf7 that are positioned between the side HSe6 (see FIG. 18) and the side CSe2 (see FIG. 18) of the substrate CS1 in the Y direction (see FIG. 18) and face the upper surface CSt of the substrate CS1 through the adhesive material BD1 in the Z direction; and a stepped surface (surface, substrate holding surface) Hf16 placed so as to be sandwiched between the plurality of stepped surfaces Hf7. In addition, the distance D7 between the upper surface CSt of the substrate CS1 and the stepped surface Hf15 (or the stepped surface Hf16) of the housing HS is larger than the distance D3 (or the distance D4) between the upper surface CSt of the substrate CS1 and the stepped surface Hf5 (or the stepped surface Hf7) of the housing HS.

In other words, in the case of the electronic device EA3, convex-shaped portions (stepped surfaces Hf5 or stepped surfaces Hf7) are provided at a plurality of positions on the stepped surface provided along the long side of the housing HS. In this case, since the substrate CS1 is supported by the convex-shaped portions at the plurality of positions in the above-described housing attaching step, the posture of the substrate CS1 is stabilized. In other words, it becomes easy to control an angle formed between each of the plurality of stepped surfaces of the housing HS and the upper surface CSt of the substrate CS1.

As illustrated in FIG. 29, the housing HS has a stepped surface Hf11 (or stepped surface Hf13) that is positioned between the stepped surface Hf6 and the stepped surface Hf5 (or stepped surface Hf7) positioned closest to the stepped surface Hf6 among the plurality of stepped surfaces Hf5 (or stepped surfaces Hf7) in the X direction and that faces the upper surface CSt of the substrate CS1 through the adhesive material BD1 in the Z direction. In addition, the distance D5 between the upper surface CSt of the substrate CS1 and the stepped surface Hf11 (or the stepped surface Hf13) of the housing HS is larger than the distance D3 (or the distance D4) between the upper surface CSt of the substrate CS1 and the stepped surface Hf5 (or the stepped surface Hf7) of the housing HS. In addition, in the example illustrated in FIG. 29, the stepped surface Hf11 (or the stepped surface Hf13) is continuous with the stepped surface Hf6, and the distance D5 has the same value as the distance D1. Therefore, a sufficient amount of the adhesive material BD1 is disposed between the upper surface CSt of the substrate CS1 and the stepped surface Hf11 (or the stepped surface Hf13) disposed at the closest position to the stepped surface Hf6 on the short-side side among the plurality of stepped surfaces having the side HSe5 (or the side HSe6) illustrated in FIG. 18.

In addition, the housing HS has a stepped surface Hf12 (or stepped surface Hf14) that is positioned between the stepped surfaces Hf8 and the stepped surface Hf5 (or stepped surface Hf7) positioned closest to the stepped surface Hf8 among the plurality of stepped surfaces Hf5 (or stepped surfaces Hf7) in the X direction and that faces the upper surface CSt of the substrate CS1 through the adhesive material BD1 in the Z direction. In addition, the distance D6 between the upper surface CSt of the substrate CS1 and the stepped surface Hf12 (or the stepped surface Hf14) of the housing HS is larger than the distance D3 (or the distance D4) between the upper surface CSt of the substrate CS1 and the stepped surface Hf5 (or the stepped surface Hf7) of the housing HS. In addition, in the example illustrated in FIG. 29, the stepped surface Hf12 (or the stepped surface Hf14) is continuous with the stepped surface Hf8, and the distance D6 has the same value as the distance D2. Therefore, a sufficient amount of the adhesive material BD1 is disposed between the upper surface CSt of the substrate CS1 and the stepped surface Hf12 (or the stepped surface Hf14) disposed at a closest position to the stepped surface Hf8 on the short-side side among the plurality of stepped surfaces having the side HSe5 (or the side HSe6) illustrated in FIG. 18.

In addition, the step surface Hf15 (or the stepped surface Hf16) illustrated in FIG. 29 is provided at the middle point of the stepped surface provided along the long side of the housing HS. In other words, the stepped surface Hf15 (or the stepped surface Hf16) includes the midpoint of the side HSe5 (or the side HSe6) of the housing HS illustrated in FIG. 18. In this case, since the convex-shaped portions are disposed on both sides between which the midpoint of the side HSe5 (or side HSe6) is sandwiched, the posture of the substrate CS1 can made it easy to be stabilized.

In addition, in the example illustrated in FIG. 29, the distance D7 of the stepped surface Hf15 (or the stepped surface Hf16) has the same value as the distance D1. Therefore, in the Z direction, the stepped surface Hf15 (or the stepped surface Hf16) is positioned at a height between the front surface SCt and the back surface SCb of the semiconductor chip SC1 illustrated in FIG. 12.

Second Modification Example

In addition, for example, in the above embodiment, the example in which the IGBT is used as the transistor Q1 constituting the switching element has been described. However, as a modification example, a power MOSFET may be used as the switching element of the inverter circuit. In the case of the power MOSFET, a body diode that is a parasitic diode is formed in a semiconductor element constituting a transistor. The body diode functions as the diode (freewheel diode) FWD illustrated in FIG. 9. For this reason, when the semiconductor chip including the power MOSFET is used, the body diode is incorporated in the semiconductor chip. Therefore, when the power MOSFET is used, one semiconductor chip may be used as one switching element.

In addition, in a case where the power MOSFET is used as the switching element of the inverter circuit, the portion described as the emitter is replaced with a source and the portion described as the collector is replaced with a drain, and thereby the description provided in the above embodiment can be applied to the second modification example. Therefore, redundant descriptions thereof will be omitted.

Third Modification Example

In addition, in the above embodiment, dimension examples of the constituent members of the electronic device EA1 have been described as an example, but various modification examples other than the examples described in the above embodiment can be applied. For example, it has been described in the above embodiment that the opening diameter of the through-hole THH (the diameter of the circular opening) illustrated in FIG. 11 is exemplified and that the opening diameter is larger than the distance between the side HSe1 of the housing HS and the side CSe1 of the substrate CS1. In addition, in the above embodiment, it has been described that the shortest distance from an edge of one through-hole THH to the side CSe3 or CSe4 of the substrate CS1 is smaller than the opening diameter of the through-hole THH. From the viewpoint of improving a fixing strength of the electronic device EA1, it is preferable to increase the diameter of the screw BOL illustrated in FIG. 14. Therefore, when the insertion position of the screw BOL is brought closer to the substrate CS1, the above relationship tends to be easily established, and thereby the substrate CS1 makes it easy to be damaged. However, even in the case of an electronic device including a through-hole THH having a small opening diameter, the technology described in the above embodiments or modification examples can be applied.

Fourth Modification Example

In addition, for example, various modification examples as mentioned above have been described, but the modification examples described above can be applied in combination.

Further, if technical ideas are extracted from the electronic devices and the manufacturing methods thereof described in the above embodiments, they can be expressed as follows.

[Supplementary Note 1]

A method of manufacturing an electronic device includes:

(a) a step of preparing a first substrate having: a first front surface on which a plurality of semiconductor chips are mounted and on which a first pattern made of metal is formed; and a first back surface that is opposite to the first front surface and on which a second pattern made of metal is formed;

(b) a step of fixing a case through an adhesive material so as to surround a peripheral portion of the first substrate;

(c) after the step (b), a step of filling an inside of the case with a sealing material, and sealing the plurality of semiconductor chips; and (d) after the step (c), a step of screwing the case to a second substrate in a state in which the first back surface of the first substrate and the second substrate face each other through a thermal conductive material, in which, when seen in a plan view from the first back surface side of the first substrate, the case has: a first long side extending in a first direction; a second long side extending in the first direction and positioned opposite the first long side; a third long side extending in the first direction and positioned between the first long side and the second long side; a fourth long side extending in the first direction and positioned between the third long side and the second long side; a first short side extending along a second direction intersecting with the first direction; a second short side extending in the second direction and positioned opposite the first short side; a third short side extending in the second direction and positioned between the first short side and the second short side; and a fourth short side extending in the second direction and positioned between the third short side and the second short side, the first substrate has: a fifth long side extending in the first direction and positioned between the first long side and the third long side; a sixth long side extending along the fifth long side and positioned between the second long side and the fourth long side; a fifth short side extending along the second direction and positioned between the first short side and the third short side; and a sixth short side extending along the fifth short side and positioned between the second short side and the fourth short side, the case has: a first surface positioned between the first short side and the fifth short side of the first substrate in a plan view; a second surface positioned opposite the first surface in a third direction that is a direction from one of the first front surface and the first back surface of the first substrate to the other thereof; a third surface positioned between the second short side and the sixth short side of the first substrate in a plan view; a fourth surface positioned opposite the third surface in the third direction; a fifth surface positioned between the third long side and the fifth long side in a plan view and facing the first front surface of the first substrate through the adhesive material in the third direction; and a sixth surface positioned between the third short side and the fifth short side in a plan view and facing the first front surface of the first substrate through the adhesive material in the third direction, in the first direction, a first hole into which a screw is inserted in the step (d) is formed to be placed between the first short side and the third short side and to stretch from one of the first surface and the second surface to the other, in the first direction, a second hole into which a screw is inserted in the step (d) is formed to be placed between the second short side and the fourth short side and to stretch from one of the third surface and the fourth surface to the other, in the third direction, the first surface of the case is positioned at a height ranging between the first front surface of the first substrate and a back surface of the second pattern, and an interval between the first front surface of the first substrate and the sixth surface of the case is larger than an interval between the first front surface of the first substrate and the fifth surface of the case.

What is claimed is:

1. A method of manufacturing an electronic device, comprising:

(a) a step of preparing a first substrate having: a first front surface on which a plurality of semiconductor chips are mounted and on which a first pattern made of metal is formed; and a first back surface that is opposite to the first front surface and on which a second pattern made of metal is formed;

(b) a step of fixing a case through an adhesive material so as to surround a peripheral portion of the first substrate;

(c) after the step (b), a step of filling an inside of the case with a sealing material, and sealing the plurality of semiconductor chips; and (d) after the step (c), a step of screwing the case to a second substrate in a state in which the first back surface of the first substrate and the second substrate face each other through a thermal conductive material, in which, when seen in a plan view from the first back surface side of the first substrate, the case has: a first long side extending in a first direction; a second long side extending in the first direction and positioned opposite the first long side; a third long side extending in the first direction and positioned between the first long side and the second long side; a fourth long side extending in the first direction and positioned between the third long side and the second long side; a first short side extending along a second direction intersecting with the first direction; a second short side extending in the second direction and positioned opposite the first short side; a third short side extending in the second direction and positioned between the first short side and the second short side; and a fourth short side extending in the second direction and positioned between the third short side and the second short side, the first substrate has: a fifth long side extending in the first direction and positioned between the first long side and the third long side; a sixth long side extending along the fifth long side and positioned between the second long side and the fourth long side; a fifth short side extending along the second direction and positioned between the first short side and the third short side; and a sixth short side extending along the fifth short side and positioned between the second short side and the fourth short side, the case has: a first surface positioned between the first short side and the fifth short side of the first substrate in a plan view; a second surface positioned opposite the first surface in a third direction that is a direction from one of the first front surface and the first back surface of the first substrate to the other thereof; a third surface positioned between the second short side and the sixth short side of the first substrate in a plan view; a fourth surface positioned opposite the third surface in the third direction; a fifth surface positioned between the third long side and the fifth long side in a plan view and facing the first front surface of the first substrate through the adhesive material in the third direction; and a sixth surface positioned between the third short side and the fifth short side in a plan view and facing the first front surface of the first substrate through the adhesive material in the third direction, in the first direction, a first hole into which a screw is inserted in the step (d) is formed to be placed between the first short side and the third short side and to stretch from one of the first surface and the second surface to the other, in the first direction, a second hole into which a screw is inserted in the step (d) is formed to be placed between the second short side and the fourth short side and to stretch from one of the third surface and the fourth surface to the other, in the third direction, the first surface of the case is positioned at a height ranging between the first front surface of the first substrate and a back surface of the second pattern, and an interval between the first front surface of the first substrate and the sixth surface of the case is larger than an interval between the first front surface of the first substrate and the fifth surface of the case.

2. The method of manufacturing the electronic device according to claim 1,
wherein, in the third direction, an interval between the first front surface of the first substrate and the sixth surface of the case is larger than a thickness of the first pattern on which the semiconductor chips are mounted.

3. The method of manufacturing the electronic device according to claim 1,
wherein the interval between the first front surface of the first substrate and the fifth surface of the case is smaller than a thickness of the first substrate.

4. The method of manufacturing the electronic device according to claim 1,
wherein the plurality of semiconductor chips mounted on a second front surface of the first pattern,
wherein the plurality of semiconductor chips each have: a third front surface; and a third back surface that is opposite to the third front surface and faces the second front surface of the first pattern, and
in the third direction, the sixth surface of the case is positioned at a height ranging between the third front surface of the semiconductor chip and the third back surface.

5. The method of manufacturing the electronic device according to claim 1,
wherein a diameter of the first hole is larger than a length from the first long side of the case to the fifth long side of the first substrate.

6. The method of manufacturing the electronic device according to claim 1,
wherein a shortest distance from an edge of the first hole to the fifth short side of the first substrate is smaller than a diameter of the first hole.

7. The method of manufacturing the electronic device according to claim 1,
wherein the case has a seventh surface positioned between the fifth surface and the sixth surface in the first direction and facing the first front surface of the first substrate through the adhesive material in the third direction, and
an interval between the first front surface of the first substrate and the seventh surface of the case is larger than the interval between the first front surface of the first substrate and the fifth surface of the case.

\* \* \* \* \*